United States Patent
Takahashi et al.

(10) Patent No.: US 12,476,218 B2
(45) Date of Patent: Nov. 18, 2025

(54) SEMICONDUCTOR DEVICE MANUFACTURING METHOD

(71) Applicant: FUJI ELECTRIC CO., LTD., Kawasaki (JP)

(72) Inventors: Hiroki Takahashi, Sendai (JP); Tsunehiro Nakajima, Matsumoto (JP); Takashi Saito, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 499 days.

(21) Appl. No.: 18/159,272

(22) Filed: Jan. 25, 2023

(65) Prior Publication Data

US 2023/0282611 A1 Sep. 7, 2023

(30) Foreign Application Priority Data

Mar. 4, 2022 (JP) .................. 2022-033151

(51) Int. Cl.
*H01L 23/00* (2006.01)
*H01L 25/00* (2006.01)
*H01L 25/07* (2006.01)

(52) U.S. Cl.
CPC .............. *H01L 24/83* (2013.01); *H01L 24/29* (2013.01); *H01L 24/32* (2013.01); *H01L 24/95* (2013.01); *H01L 25/072* (2013.01); *H01L 25/50* (2013.01); *H01L 24/37* (2013.01); *H01L 24/40* (2013.01); *H01L 24/45* (2013.01); *H01L 24/48* (2013.01); *H01L 24/73* (2013.01); *H01L 2224/29139* (2013.01); *H01L 2224/32225* (2013.01); *H01L 2224/37147* (2013.01); *H01L 2224/37638* (2013.01); *H01L 2224/37655* (2013.01); *H01L 2224/40225* (2013.01); *H01L 2224/45124* (2013.01); *H01L 2224/45144* (2013.01); *H01L 2224/45147* (2013.01);

(Continued)

(58) Field of Classification Search
None
See application file for complete search history.

(56) References Cited

U.S. PATENT DOCUMENTS

| | | |
|---|---|---|
| 2003/0173660 A1 | 9/2003 | Kitamura et al. |
| 2016/0197024 A1* | 7/2016 | Sakamoto ........... H01L 23/3735 438/119 |

(Continued)

FOREIGN PATENT DOCUMENTS

| | | |
|---|---|---|
| EP | 1345480 A2 | 9/2003 |
| EP | 3057125 A1 | 8/2016 |

(Continued)

*Primary Examiner* — Sue A Purvis
*Assistant Examiner* — Jordan M Klein
(74) *Attorney, Agent, or Firm* — Rabin & Berdo, P.C.

(57) ABSTRACT

When a semiconductor unit is heated, a heater having a flat heating surface is used for performing heating in a state in which a lower surface of an insulated circuit board is placed on the heating surface. When the semiconductor unit is cooled, a cooler having a cooling surface including a pair of support portions is used for performing cooling in which a lower surface of a pair of outer regions of the insulated circuit board are respectively placed to be contact with the pair of support portions, and in which a central region between the pair of outer regions of the insulated circuit board is pressed downward so as to be downward convex.

20 Claims, 24 Drawing Sheets

(52) U.S. Cl.
CPC ............... *H01L 2224/48106* (2013.01); *H01L 2224/48225* (2013.01); *H01L 2224/73221* (2013.01); *H01L 2224/73263* (2013.01); *H01L 2224/73265* (2013.01); *H01L 2224/83054* (2013.01); *H01L 2224/83201* (2013.01); *H01L 2224/83395* (2013.01); *H01L 2224/83439* (2013.01); *H01L 2224/83455* (2013.01); *H01L 2224/83463* (2013.01); *H01L 2224/83815* (2013.01); *H01L 2224/8384* (2013.01); *H01L 2224/83948* (2013.01); *H01L 2224/95053* (2013.01); *H01L 2924/01005* (2013.01); *H01L 2924/0132* (2013.01); *H01L 2924/10253* (2013.01); *H01L 2924/10272* (2013.01); *H01L 2924/13055* (2013.01); *H01L 2924/13091* (2013.01); *H01L 2924/20105* (2013.01); *H01L 2924/20106* (2013.01)

(56) References Cited

U.S. PATENT DOCUMENTS

| | | | |
|---|---|---|---|
| 2016/0254209 A1* | 9/2016 | Oohiraki | H01L 23/3675 257/707 |
| 2017/0236819 A1 | 8/2017 | Kanai et al. | |
| 2018/0184538 A1* | 6/2018 | Bayerer | H05K 7/2039 |
| 2019/0157183 A1* | 5/2019 | Kai | H01L 21/4803 |

FOREIGN PATENT DOCUMENTS

| | | |
|---|---|---|
| JP | 2003-273289 A | 9/2003 |
| JP | 2005-294792 A | 10/2005 |
| JP | 2015-076551 A | 4/2015 |
| JP | 2017-147327 A | 8/2017 |

\* cited by examiner

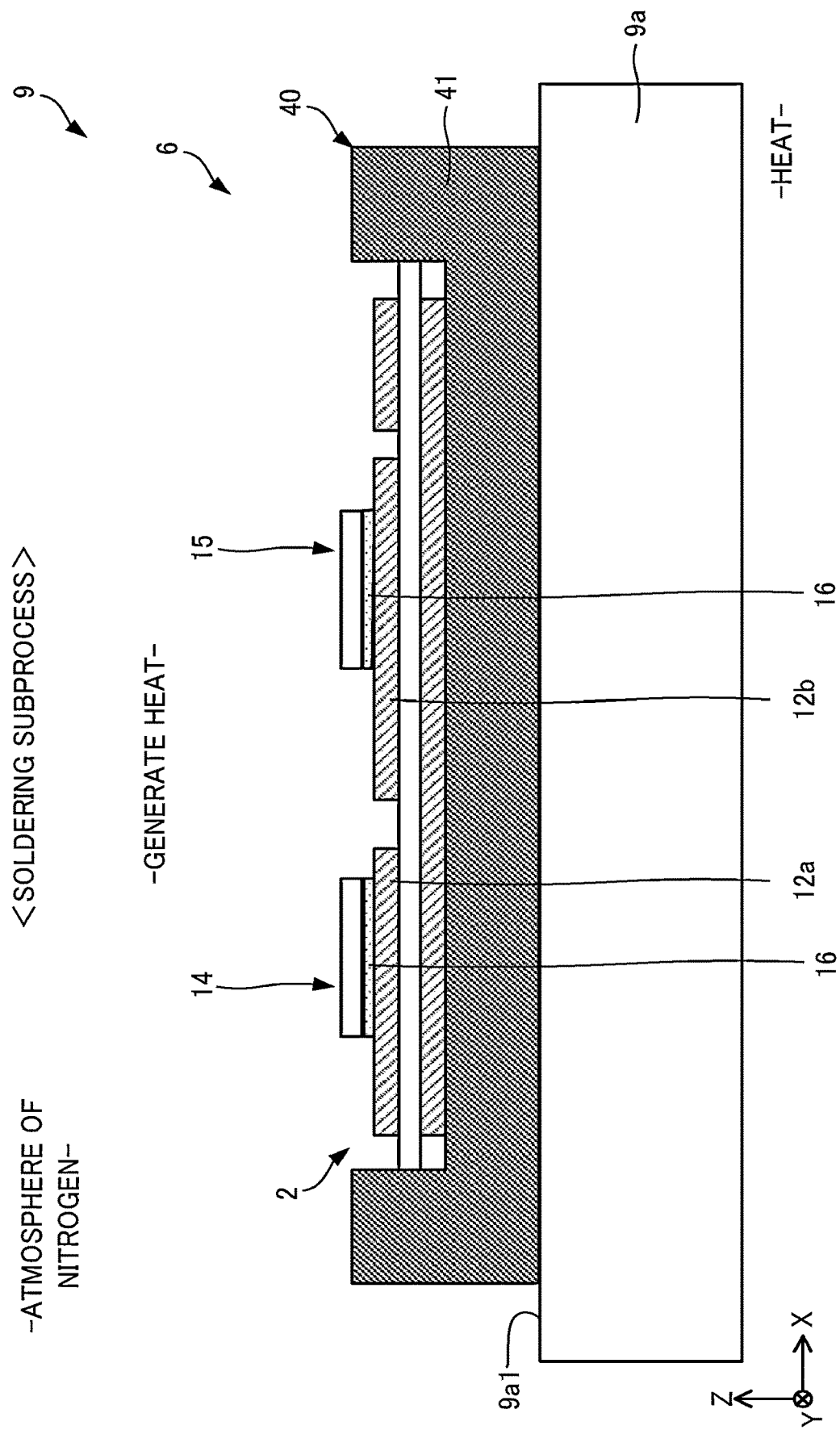

SEMICONDUCTOR DEVICE MANUFACTURING METHOD

CROSS-REFERENCE TO RELATED APPLICATION

This application is based upon and claims the benefit of priority of the prior Japanese Patent Application No. 2022-033151, filed on Mar. 4, 2022, the entire contents of which are incorporated herein by reference.

BACKGROUND OF THE INVENTION

1. Field of the Invention

The embodiments discussed herein relate to a semiconductor device manufacturing method.

2. Background of the Related Art

Semiconductor devices include power devices used as a power converter. The power devices are insulated gate bipolar transistors (IGBTs), power metal oxide semiconductor field effect transistors (MOSFETs), or the like. A semiconductor device includes semiconductor chips including power devices, an insulated circuit board, and a metal base plate. For example, the insulated circuit board includes an insulating plate which is a ceramic plate, a plurality of wiring boards formed over the front surface of the insulating plate, and a metal layer formed on the back surface of the insulating plate. For example, the semiconductor chips and lead frames are bonded to the wiring boards with a bonding member therebetween. Furthermore, the insulated circuit board is bonded to the metal base plate with a bonding member.

For example, if the bonding member is solder and the semiconductor chips are bonded to the wiring boards of the insulated circuit board with solder therebetween, first the solder is melted by heating. Next, the molten solder is cooled. The semiconductor chips are bonded to the wiring boards of the insulated circuit board by the solidified solder. Furthermore, the insulated circuit board including the wiring boards to which the semiconductor chips are bonded is bonded to the metal base plate.

Japanese Laid-open Patent Publication No. 2017-147327

By the way, with an insulated circuit board, an insulating plate, a wiring board, and metal plate differ in linear expansion coefficient. In the process of heating and cooling for bonding semiconductor chips to the insulated circuit board with a bonding member, the metal plate on the back surface of an insulating plate contracts significantly. Accordingly, the insulated circuit board warps upward convexly with the wiring board side up. An upward convex warp of the insulated circuit board may cause positional deviations of the semiconductor chips. This decreases the production yield of the assembly of semiconductor devices. Furthermore, if the insulated circuit board is bonded to the metal base plate in a state in which the insulated circuit board warps upward convexly, then a bonding member between the back surface of the insulated circuit board and the front surface of the metal base plate becomes thicker. This increases thermal resistance and deteriorates the heat dissipation property.

SUMMARY OF THE INVENTION

According to an aspect, there is provided a semiconductor device manufacturing method, including: preparing a semiconductor chip, a bonding member, and an insulated circuit board including an insulating plate, a wiring board on a front surface of the insulating plate, and a metal plate on a back surface of the insulating plate; assembling a semiconductor unit by arranging the semiconductor chip on the wiring board with the bonding member therebetween; heating the semiconductor unit; and cooling the semiconductor unit, wherein: in the heating the semiconductor unit, a heater having a heating surface including a flat surface is used for performing the heating in a state in which a lower surface of the insulated circuit board is placed on the flat surface; and in the cooling the semiconductor unit, a cooler having a cooling surface including a pair of support portions is used for performing the cooling in a state in which lower surfaces of a pair of outer regions of the insulated circuit board are respectively placed in contact with the pair of support portions, and in which a central region between the pair of outer regions of the insulated circuit board is pressed downward so as to be downwardly convex.

The object and advantages of the invention will be realized and attained by means of the elements and combinations particularly pointed out in the claims.

It is to be understood that both the foregoing general description and the following detailed description are exemplary and explanatory and are not restrictive of the invention.

BRIEF DESCRIPTION OF THE DRAWINGS

FIG. 24 illustrates a soldering subprocess included in the chip bonding process according to the second embodiment.

DETAILED DESCRIPTION OF THE INVENTION

Embodiments will now be described by reference to the accompanying drawings. In the following description, a "front surface" or an "upper surface" indicates a surface of a semiconductor device 1 of FIG. 1 which faces the upper side (+Z direction). Similarly, an "upside" indicates the upward direction (+Z direction) of the semiconductor device 1 of FIG. 1. A "back surface" or a "lower surface" indicates a surface of the semiconductor device 1 of FIG. 1 which faces the lower side (−Z direction). Similarly, a "downside" indicates the downward direction (−Z direction) of the semiconductor device 1 of FIG. 1. These terms mean the same directions as needed in the other drawings. The "front surface," the "upper surface," the "upside," the "back surface," the "lower surface," the "downside," and a "side" are simply used as expedient representation for specifying relative positional relationships and do not limit the technical idea of the present disclosure. For example, the "upside" or the "downside" does not always mean the vertical direction relative to the ground. That is to say, a direction indicated by the "upside" or the "downside" is not limited to the gravity direction. Furthermore, in the following description, a "main ingredient" indicates an ingredient contained at a rate of 80 volume percent (vol %) or more. In addition, in the following description, "approximately parallel" or "approximately horizontal" means that an angle which one object forms with the other object is in the range of 170° to 190°. "Approximately right angle" or "approximately vertical" means that an angle which one object forms with the other object is in the range of 85° to 95°.

First Embodiment

Figure 1:
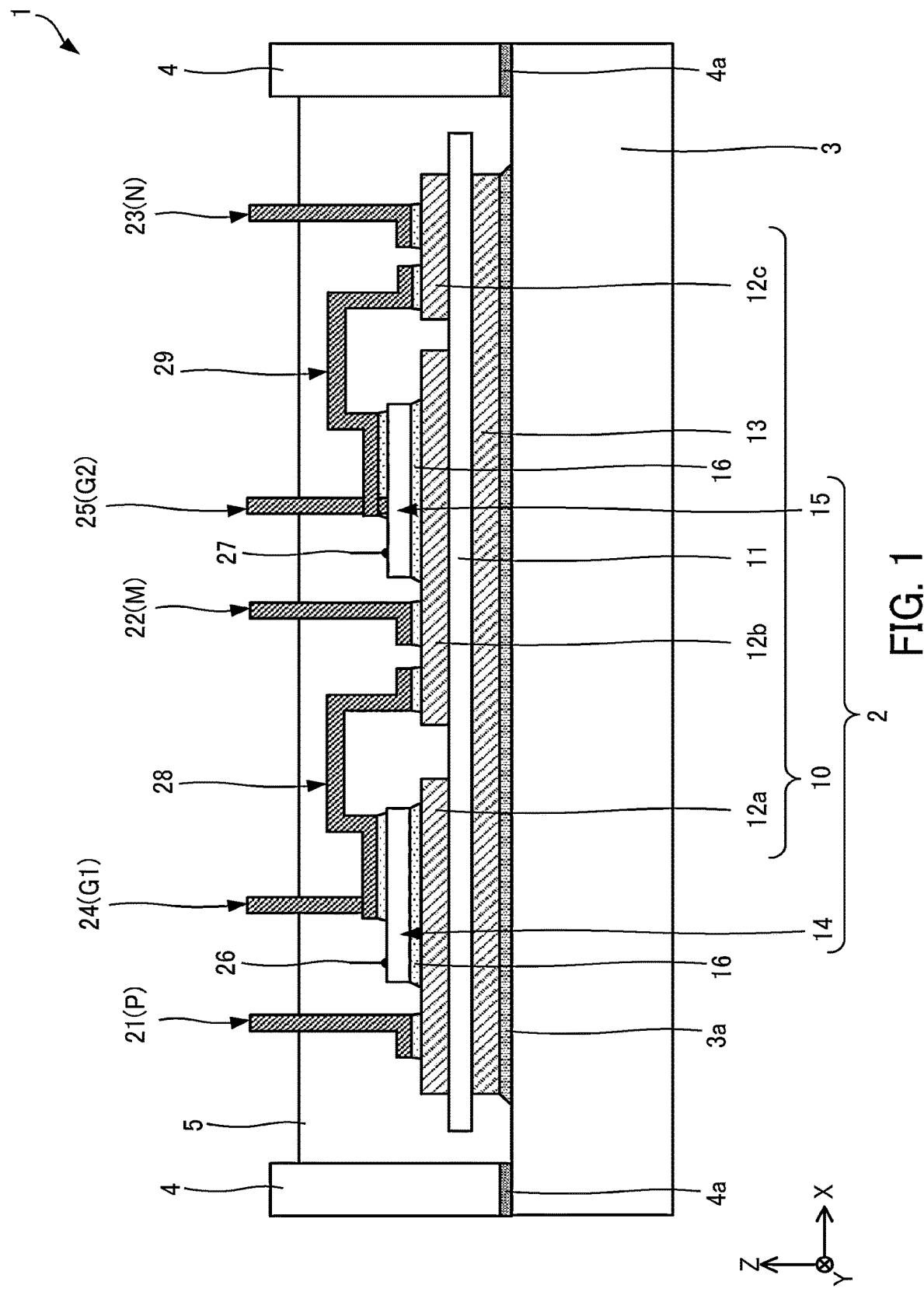
FIG. 1 is a sectional side elevation view of a semiconductor device.
Figure 2:
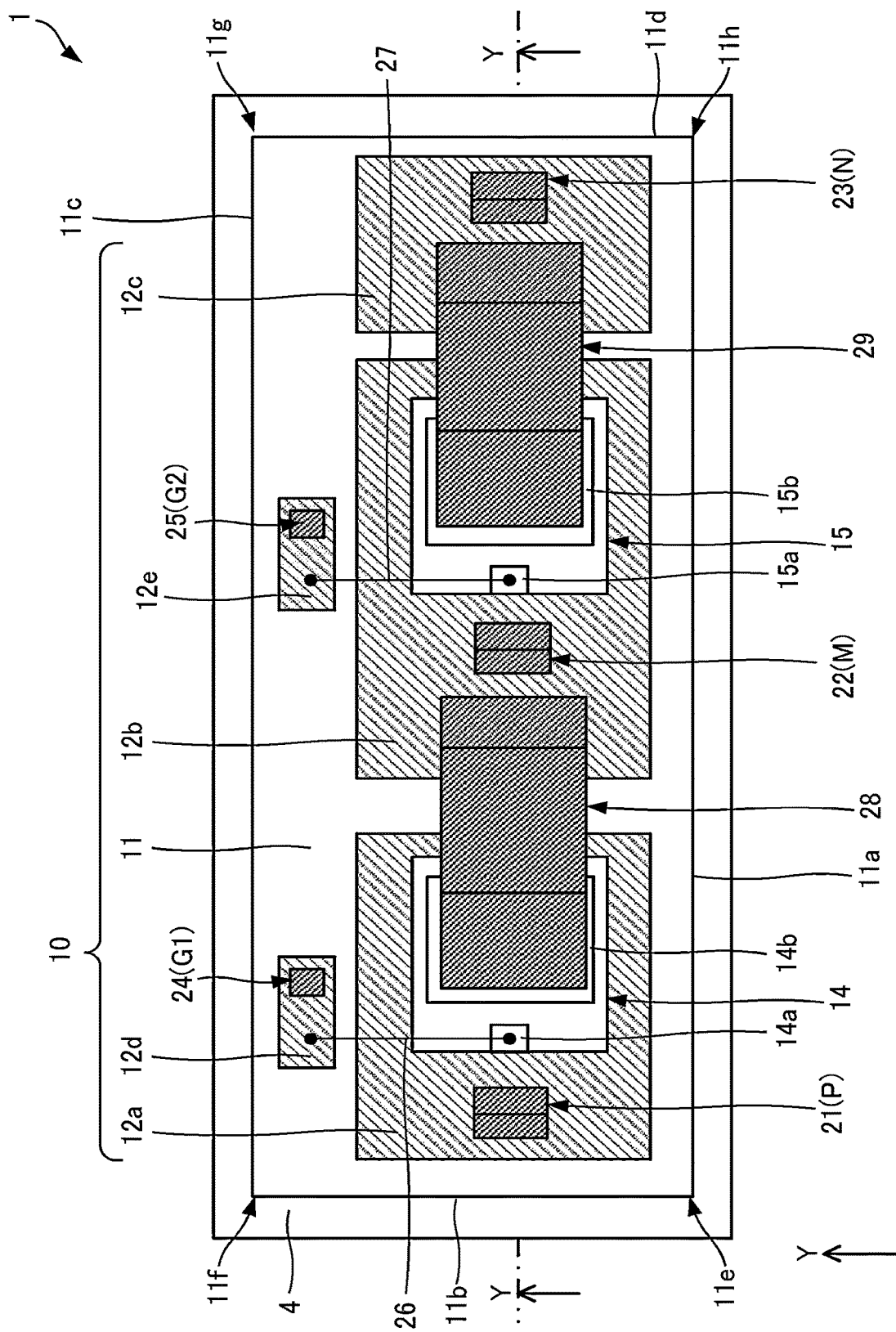
FIG. 2 is a plan view of the semiconductor device.
Figure 3A:
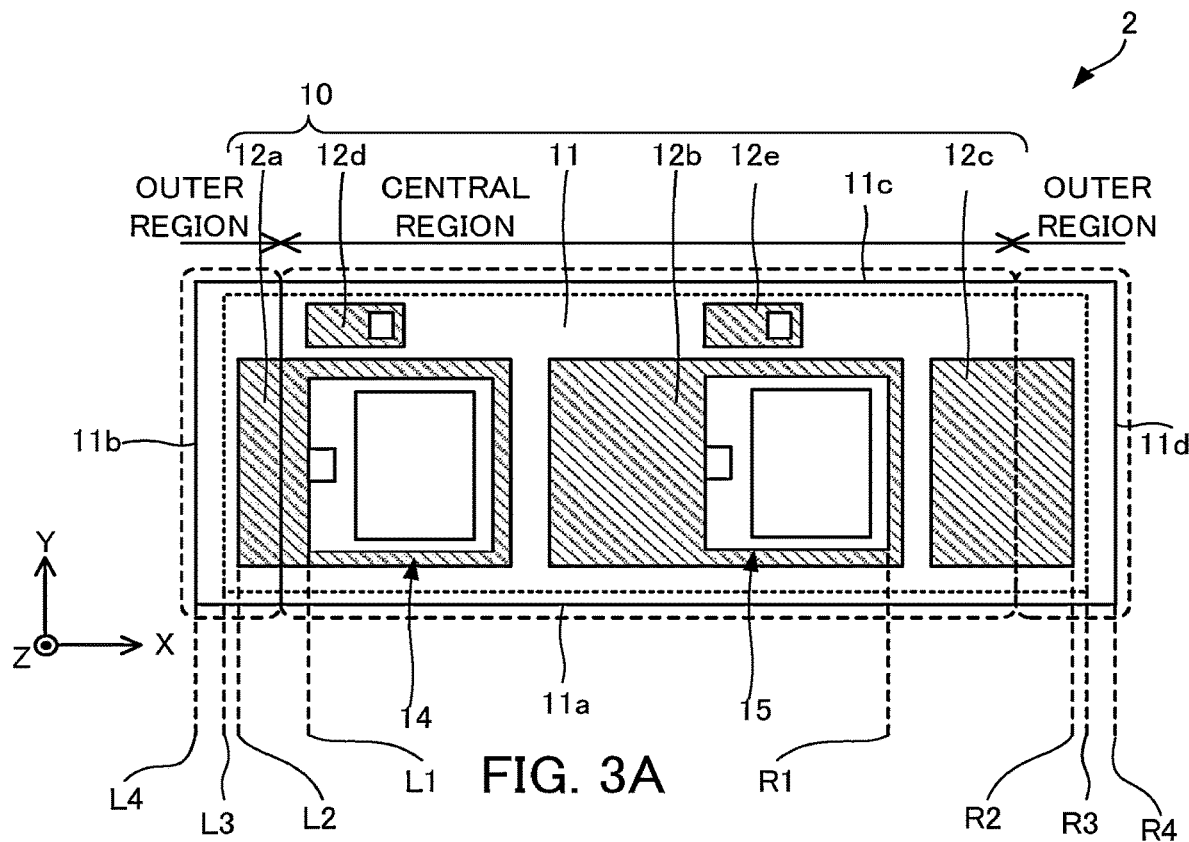
FIGS. 3A and 3B illustrate a semiconductor unit included in the semiconductor device.
Figure 3B:
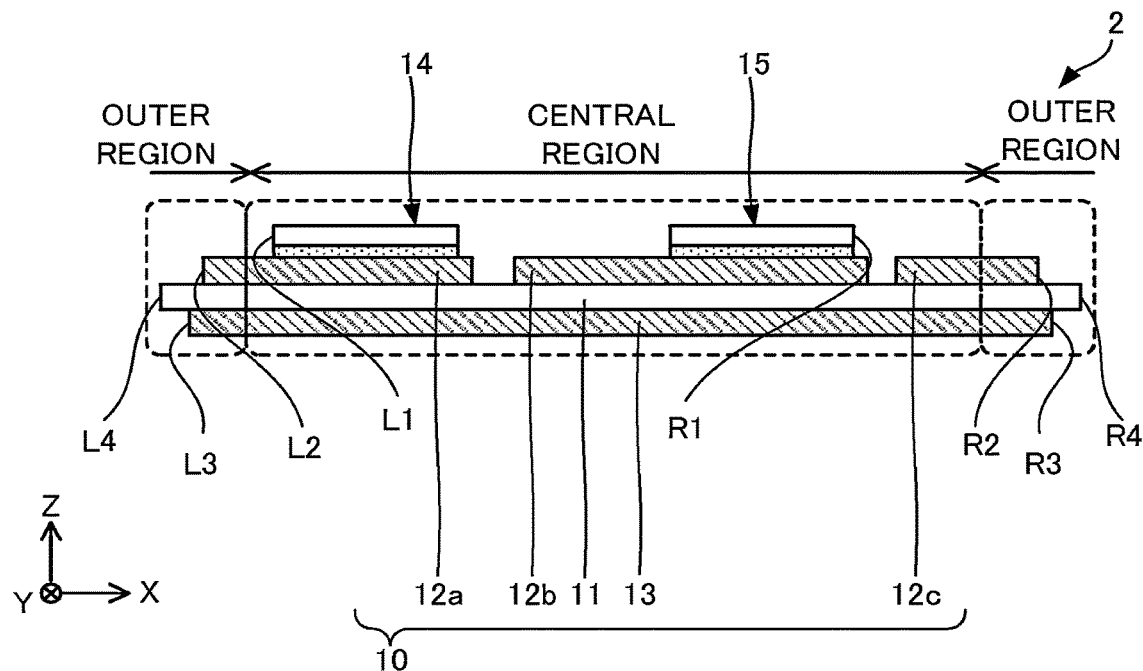
Figure 4:
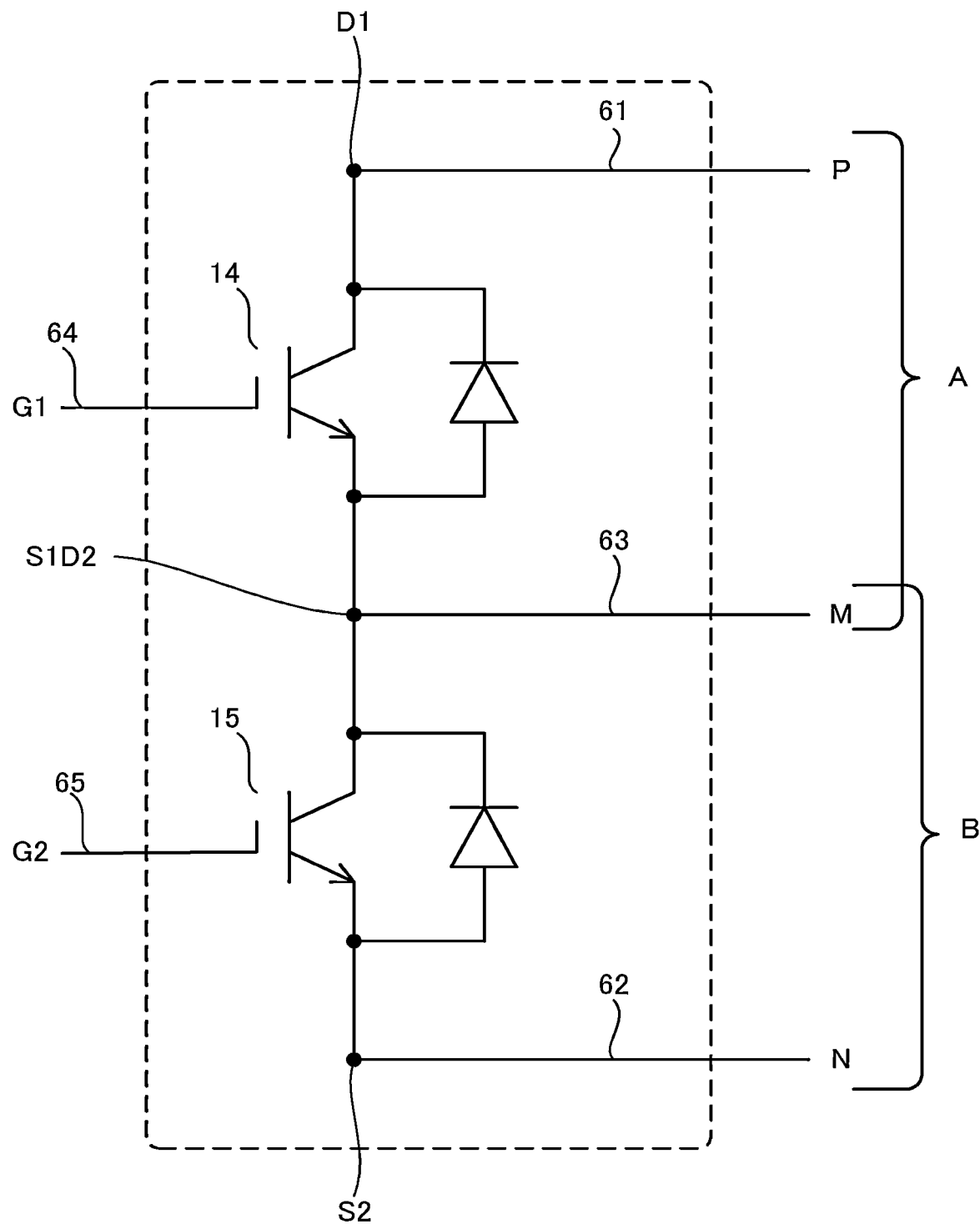
FIG. 4 illustrates an equivalent circuit included in the semiconductor device.

In a first embodiment, a case where sintered metal is used as a bonding member 16 with which an insulated circuit board 10 and semiconductor chips 14 and 15 are bonded together will be described. The insulated circuit board 10 and the semiconductor chips 14 and 15 will be described later. A semiconductor device will now be described with reference to FIG. 1 through FIG. 4. FIG. 1 is a sectional side elevation view of a semiconductor device. FIG. 2 is a plan view of the semiconductor device. FIG. 1 is a sectional view taken along the dot-dash line Y-Y of FIG. 2. FIG. 2 does not illustrate a sealing member 5. FIGS. 3A and 3B illustrate a semiconductor unit included in the semiconductor device. FIG. 3A is a plan view of a semiconductor unit 2. FIG. 3B is a side view of the semiconductor unit 2 viewed from the +Y direction. Furthermore, FIG. 4 illustrates an equivalent circuit included in the semiconductor device.

A semiconductor device 1 includes at least the semiconductor unit 2, a metal base plate 3, and a case 4 which houses the semiconductor unit 2. External connection terminals 21 through 25, wires 26 and 27, and lead frames 28 and 29 are formed over the semiconductor unit 2. Furthermore, the inside of the case 4 may be sealed with a sealing member 5.

The semiconductor unit 2 includes the insulated circuit board 10 and the semiconductor chips 14 and 15. The insulated circuit board 10 is rectangular in plan view. The insulated circuit board 10 includes an insulating plate 11, wiring boards 12a through 12e formed over the front surface of the insulating plate 11, and a metal plate 13 formed on the back surface of the insulating plate 11. The external shape of the wiring boards 12a through 12e and the metal plate 13 is smaller in plan view than that of the insulating plate 11 and the wiring boards 12a through 12e and the metal plate 13 are formed inside the insulating plate 11 in plan view. The shape or number of the wiring boards 12a through 12e is an example.

The insulating plate 11 is rectangular in plan view. Furthermore, corner portions of the insulating plate 11 may be chamfered. For example, the corner portions of the insulating plate 11 may be C-chamfered or R-chamfered. The insulating plate 11 is surrounded on all sides by a long side 11a, a short side 11b, a long side 11c, and a short side 11d which are outer peripheral sides. In addition, the insulating plate 11 includes a corner portion 11e formed by the long side 11a and the short side 11b and a corner portion 11f formed by the short side 11b and the long side 11c. Moreover, the insulating plate 11 includes a corner portion 11g formed by the long side 11c and the short side 11d and a corner portion 11h formed by the short side 11d and the long side 11a.

The insulating plate 11 is made of a ceramic having high thermal conductivity. Such a ceramic is made of a material which contains as a main ingredient aluminum oxide, aluminum nitride, silicon nitride, or the like. In addition, the thickness of the insulating plate 11 is greater than or equal to 0.2 mm and smaller than or equal to 2.0 mm.

The wiring boards 12a through 12e are made of metal having good electrical conductivity. For example, such metal is copper or a copper alloy. Furthermore, in order to improve corrosion resistance and bondability, plating treatment may be performed. At this time, nickel, a nickel-phosphorus alloy, a nickel-boron alloy, silver, a silver alloy, or the like is used as a plating material. In addition, for example, the thickness of the wiring boards 12a through 12e is greater than or equal to 0.1 mm and smaller than or equal to 1.0 mm.

Each of the wiring boards 12a through 12e is rectangular in plan view. The wiring board 12a is formed in parallel with the long side 11a and the short side 11b of the insulating plate 11 near the corner portion 11e. That is to say, the wiring board 12a is an outermost wiring board, of the wiring boards 12a through 12e formed over the insulating plate 11, on the side of the short side 11b of the insulating plate 11 (in the −X direction). The wiring board 12b is formed in parallel with the long side 11a and the short side 11b of the insulating plate 11 next to the wiring board 12a on the side of the short side 11d. The wiring board 12c is formed in parallel with the long side 11a and the short side 11d of the insulating plate 11 near the corner portion 11h. That is to say, the wiring board 12c is an outermost wiring board, of the wiring boards 12a through 12e formed over the insulating plate 11, on the side of the short side 11d of the insulating plate 11 (in the +X direction). The wiring boards 12a through 12c are arranged in line in parallel with the long sides 11a and 11c of the insulating plate 11.

Furthermore, the wiring board 12d is formed along the long side 11c next to the wiring board 12a (control electrode 14a of the semiconductor chip 14) on the side of the long side 11c. The wiring board 12e is formed along the long side 11c next to the wiring board 12b (control electrode 15a of the semiconductor chip 15) on the side of the long side 11c. The wiring boards 12d and 12e are arranged in line in parallel with the long sides 11a and 11c of the insulating plate 11.

The metal plate 13 is made of a material which contains as a main ingredient metal having high thermal conductivity. Such metal is aluminum, iron, silver, copper, an alloy containing at least one of them, or the like. Furthermore, in order to improve corrosion resistance and bondability, plating treatment may be performed. At this time, nickel, a nickel-phosphorus alloy, a nickel-boron alloy, silver, a silver alloy, or the like is used as a plating material.

A direct copper bonding (DCB) substrate, an active metal brazed (AMB) substrate, or the like may be used as the insulated circuit board 10 having the above structure. The insulated circuit board 10 is bonded to the metal base plate 3 with a bonding member 3a therebetween. The insulated circuit board 10 transfers heat generated by the semiconductor chips 14 and 15 to the side of the metal base plate 3 via the wiring boards 12a and 12b respectively, the insulating plate 11, and the metal plate 13.

An end portion of each component of the semiconductor unit 2 will be described further. With the insulated circuit board 10, as illustrated in FIGS. 3A and 3B, the long sides 11a and 11c are parallel in the ±X direction (in the longitudinal direction) and the short sides 11b and 11d are parallel in the ±Y direction (in the lateral direction). In each of FIGS. 3A and 3B, a position in which the metal plate 13 is formed is indicated by a dashed line.

It is assumed that a side of the semiconductor chip 14 on the side of the short side 11b is an end portion L1 and that a side of the wiring board 12a on the side of the short side 11b is an end portion L2. Furthermore, it is assumed that a side of the metal plate 13 on the side of the short side 11b is an end portion L3 and that the short side 11b of the insulating plate 11 is an end portion L4.

In addition, it is assumed that a side of the semiconductor chip 15 on the side of the short side 11d is an end portion R1 and that a side of the wiring board 12c on the side of the short side 11d is an end portion R2. Furthermore, it is assumed that a side of the metal plate 13 on the side of the short side 11d is an end portion R3 and that the short side 11d of the insulating plate 11 is an end portion R4.

On the upper surface of the insulated circuit board (semiconductor unit 2), a region in the longitudinal direction including at least the semiconductor chips 14 and 15 is considered as a central region. The central region is at least a region between the end portion L1 and the end portion R1.

Moreover, on the upper surface of the insulated circuit board 10 (semiconductor unit 2), a region in the longitudinal direction including at least the end portion L4 of the insulating plate 11 and the end portion L3 of the metal plate 13 is considered as an outer region. Furthermore, a region in the longitudinal direction including the end portion L4 of the insulating plate 11 and the end portion L2 of the wiring board 12a is preferably considered as an outer region.

In addition, on the upper surface of the insulated circuit board 10 (semiconductor unit 2), a region in the longitudinal direction including at least the end portion R4 of the insulating plate 11 and the end portion R3 of the metal plate 13 is considered as an outer region. Furthermore, a region in the longitudinal direction including the end portion R4 of the insulating plate 11 and the end portion R2 of the wiring board 12c is preferably considered as an outer region.

As a result, boundaries between the central region and the outer regions are between the end portion L3 of the metal plate 13 and the end portion L1 of the semiconductor chip 14 and between the end portion R3 of the metal plate 13 and the end portion R1 of the semiconductor chip 15. The boundaries between the central region and the outer regions are preferably between the end portion L2 of the wiring board 12a and the end portion L1 of the semiconductor chip 14 and between the end portion R2 of the wiring board 12c and the end portion R1 of the semiconductor chip 15.

Each of the external connection terminals 21 through 25 has the shape of a plate, a pole, or a pipe. In this case, an example in which each of the external connection terminals 21 through 25 has the shape of a flat plate is taken. As illustrated in FIG. 1, upper end portions of the external connection terminals 21 through 25 extend outward (in the +Z direction) from the sealing member 5. The upper end portions of the external connection terminals 21 through 25 extend outward from the upper surface of the sealing member 5 and may extend horizontally (in the +X direction, for example). Furthermore, as described later, if a lid (not illustrated) which covers a space over the sealing member 5 is located, then the upper end portions of the external connection terminals 21 through 25 may extend outward (in the +Z direction) from the lid. In addition, the upper end portions of the external connection terminals 21 through 25 may extend outward from the upper surface of the lid and may extend horizontally (in the +X direction, for example). Moreover, the upper end portions of the external connection terminals 21 through 25 may be connected to external devices (not illustrated). The external connection terminals 21 through are made of metal, such as copper or a copper alloy, having good electrical conductivity. Furthermore, in order to improve corrosion resistance and bondability, plating treatment may be performed. At this time, nickel, a nickel-phosphorus alloy, a nickel-boron alloy, silver, a silver alloy, or the like is used as a plating material.

The external connection terminal 21 is located over a portion of the wiring board 12a between an end portion in the −X direction of the wiring board 12a and the semiconductor chip 14. A lower end portion of the external connection terminal 21 is bonded to the wiring board 12a with a bonding member. The external connection terminal 21 extends upward (in the +Z direction) with respect to the front surface of the wiring board 12a from the portion of the wiring board 12a to which the external connection terminal 21 is bonded.

The external connection terminal 22 is located over a portion of the wiring board 12b between the semiconductor chip 15 over the wiring board 12b and the lead frame 28 described later. A lower end portion of the external connection terminal 22 is bonded to the wiring board 12b with the bonding member. The external connection terminal 22 extends upward (in the +Z direction) with respect to the front surface of the wiring board 12b from the portion of the wiring board 12b to which the external connection terminal 22 is bonded.

The external connection terminal 23 is located over a portion of the wiring board 12c between an end portion in the +X direction of the wiring board 12c and the lead frame 29 described later. A lower end portion of the external connection terminal 23 is bonded to the wiring board 12c with the bonding member. The external connection terminal 23 extends upward (in the +Z direction) with respect to the front surface of the wiring board 12c from the portion of the wiring board 12c to which the external connection terminal 23 is bonded.

The external connection terminals 24 and 25 are located over the wiring boards 12d and 12e, respectively, on the side of the +X direction. Lower end portions of the external connection terminals 24 and 25 are bonded to the wiring boards 12d and 12e, respectively, with the bonding member. The external connection terminals 24 and 25 extend upward (in the +Z direction) with respect to the front surfaces of the wiring boards 12d and 12e from portions of the wiring boards 12d and 12e to which the external connection terminal 24 and 25, respectively, are bonded.

In addition, the wires 26 and 27 directly connect the wiring boards 12d and 12e and the control electrodes 14a and 15a of the semiconductor chips 14 and 15 respectively. Each of the wires 26 and 27 contains as a main ingredient a material, such as gold, copper, aluminum, or an alloy containing at least one of them, having good electrical conductivity. Each of the wires 26 and 27 is preferably made of an aluminum alloy containing a very small amount of silicon. Furthermore, for example, the diameter of the wires 26 and 27 is larger than or equal to 100 μm and smaller than or equal to 400 μm.

The lead frames 28 and 29 are made of metal, such as copper or a copper alloy, having good electrical conductivity. Furthermore, in order to improve corrosion resistance, plating treatment may be performed. At this time, nickel, a nickel-phosphorus alloy, a nickel-boron alloy, or the like is used as a plating material.

The lead frame 28 directly connects an output electrode 14b of the semiconductor chip 14 and the wiring board 12b. One end portion of the lead frame 28 is bonded to the output electrode 14b of the semiconductor chip 14 and the other end portion of the lead frame 28 is bonded to a portion of the wiring board 12b next to the external connection terminal 22 in the −X direction. The lead frame 29 directly connects an output electrode 15b of the semiconductor chip 15 and the wiring board 12c. One end portion of the lead frame 29 is bonded to the output electrode 15b of the semiconductor chip and the other end portion of the lead frame 29 is bonded to a portion of the wiring board 12c next to the external connection terminal 23 in the −X direction.

The one end portions of the lead frames 28 and 29 may be bonded to the output electrodes 14b and 15b of the semiconductor chips 14 and 15, respectively, with a bonding member (solder or a sintered metal body). The external connection terminals 21 through 25 and the other end portions of the lead frames 28 and 29 may be bonded to the wiring boards 12a through 12e and the wiring boards 12b and 12c, respectively, with the same bonding member or by ultrasonic bonding.

The metal base plate 3 is rectangular in plan view. The back surface of the insulated circuit board 10 is bonded to the front surface of the metal base plate 3 with the bonding member 3a. Furthermore, the case 4 is bonded to the metal base plate 3 with an adhesive member 4a so as to surround the outer periphery of the metal base plate 3 on all sides. The area of the front surface of the metal base plate 3 is sufficient to fix the insulated circuit board 10 and the case 4. The metal base plate 3 contains as a main ingredient a material having high thermal conductivity. Such a material is aluminum, iron, silver, copper, an alloy containing at least one of them, or the like. Furthermore, in order to improve corrosion resistance, plating treatment may be performed. At this time, nickel, a nickel-phosphorus alloy, a nickel-boron alloy, or the like is used as a plating material. In addition, the metal base plate 3 and a plurality of fins may be integrally formed. Moreover, a water-cooling cooler may be used in place of the metal base plate 3. That is to say, the insulated circuit board 10 and the case 4 may be bonded to the front surface of a top plate of a cooler in the same way that is described above.

The case 4 is rectangular and has the shape of a frame having an opening inside, in plan view. The case 4 surrounds the semiconductor chips 14 and 15, the insulated circuit board 10, and the lower end portions of the external connection terminals 21 through 25. Furthermore, the opening of the case 4 is filled with the sealing member 5. The lower surface of the case 4 is bonded to the metal base plate 3 with the adhesive member 4a. In addition, the case 4 may further include a lid (not illustrated) which covers a space over the opening. The upper end portions of the external connection terminals 21 through 25 may extend outward from the case 4. The case 4 is molded out of, for example, a thermoplastic resin such as polyphenylene sulfide resin, polybutylene terephthalate resin, polybutylene succinate resin, polyamide resin, or acrylonitrile butadiene styrene resin.

The bonding member 3a is, for example, solder. Pb-free solder containing a determined alloy as a main ingredient is used as the solder. For example, the determined alloy is at least one of a tin-silver alloy, a tin-zinc alloy, and a tin-antimony alloy. The solder may contain an additive such as copper, bismuth, indium, nickel, germanium, cobalt, or silicon. Furthermore, the bonding member 3a may be a sintered metal. The sintered metal is metal containing silver as a main ingredient. In particular, the bonding member 3a used for bonding the insulated circuit board 10 and the metal base plate 3 together may be silver solder.

A thermoplastic resin-based adhesive which softens and solidifies according to temperature or a thermosetting resin-based adhesive which solidifies by a chemical reaction at the time of heating is used as the adhesive member 4a. A thermoplastic resin is vinyl acetate resin, polyvinyl alcohol, polyamide resin, or the like. Furthermore, a thermosetting resin is epoxy resin, silicone resin, polyimide resin, urethane resin (polyurethane), ester resin (polyester), or the like.

Each of the semiconductor chips 14 and 15 may include a switching element which is a power MOSFET. In that case, the semiconductor chips 14 and 15 have on the front surfaces gate electrodes as the control electrodes 14a and 15a, respectively, and source electrodes as the output electrodes 14b and 15b, respectively, which are main electrodes. The control electrodes 14a and 15a are located in the center of side portions of the front surfaces and the output electrodes 14b and 15b are located on central portions of the front surfaces. Furthermore, the semiconductor chips 14 and 15 have on the back surfaces drain electrodes as input electrodes which are main electrodes. The semiconductor chips 14 and 15 are preferably made of silicon carbide.

Each of the semiconductor chips 14 and 15 may include a switching element which is an IGBT. In that case, the semiconductor chips 14 and 15 also have on the front surfaces gate electrodes as the control electrodes 14a and 15a, respectively, and emitter electrodes as the output electrodes 14b and 15b, respectively, which are main electrodes. Furthermore, the semiconductor chips 14 and 15 have on the back surfaces collector electrodes as input electrodes which are main electrodes. In addition, each of the semiconductor chips 14 and 15 may include a switching element which is a reverse conducting (RC)-IGBT. With the RC-IGBT an IGBT and a free wheeling diode (FWD) are formed in one chip. In that case, the semiconductor chips 14 and 15 may be made of silicon.

The semiconductor chip 14 is bonded to the wiring board 12a with the bonding member 16 therebetween and the semiconductor chip 15 is bonded to the wiring board 12b with the bonding member 16 therebetween. The semiconductor chip 14 corresponds to an upper arm A described later and the semiconductor chip 15 corresponds to a lower arm B described later. The semiconductor chips 14 and 15 are connected in series by the lead frame 28. In the first embodiment, the bonding member 16 is a sintered metal and is a porous metal containing silver as a main ingredient.

The inside of the case 4 may be sealed with the sealing member 5. The sealing member 5 seals the insulated circuit board 10 and the semiconductor chips 14 and 15 over the front surface of the metal base plate 3, one end portions of the external connection terminals 21 through 25, the wires 26 and 27, and the lead frames 28 and 29. For example, the sealing member 5 contains a thermosetting resin and a filling material contained in a thermosetting resin. The thermosetting resin is epoxy resin, phenolic resin, maleimide resin, or the like. An example of the sealing member 5 is epoxy resin containing a filling material. An inorganic matter is used as the filling material. For example, the inorganic matter is silicon oxide, aluminum oxide, boron nitride, or aluminum nitride. Silicone gel may be used as the sealing member 5 in place of the above materials.

As illustrated in FIG. 4, the above semiconductor device 1 is a half-bridge circuit including the upper arm A and the lower arm B. A connection point P is connected to a positive electrode of an external power supply (not illustrated). The connection point P and a connection point D1 of the input electrode (drain electrode) of the semiconductor chip 14 are connected by a wiring 61 (external connection terminal 21 and the wiring board 12a).

A connection point M is connected to a load (not illustrated). The connection point M and a connection point S1D2 of the output electrode (source electrode) of the semiconductor chip 14 and the input electrode (drain electrode) of the semiconductor chip 15 are connected by a wiring 63 (lead frame 28, the wiring board 12b, and the external connection terminal 22 and the wiring board 12b and the external connection terminal 22).

A connection point N is connected to a negative electrode of the external power supply (not illustrated). The connection point N and a connection point S2 of the output electrode (source electrode) of the semiconductor chip 15 are connected by a wiring 62 (lead frame 29, the wiring board 12c, and the external connection terminal 23).

When the semiconductor device 1 operates, potential at the connection point P is higher than potential at the connection point M. As a result, the potential of the wiring 61 is higher than that of the wiring 63. Furthermore, potential at the connection point M is higher than potential at the connection point N. As a result, the potential of the wiring 63 is higher than that of the wiring 62.

Connection points G1 and G2 are connected to a control power source (not illustrated). The connection point G1 is connected to the control electrode 14a of the semiconductor chip 14 by a wiring 64 (external connection terminal 24, the wiring board 12d, and the wire 26). The connection point G2 is connected to the control electrode 15a of the semiconductor chip 15 by a wiring 65 (external connection terminal 25, the wiring board 12e, and the wire 27).

The upper arm A of the semiconductor device 1 includes the wiring boards 12a and 12d of the insulated circuit board 10, the semiconductor chip 14, the external connection terminals 21 and 24, and the wire 26. The lower arm B of the semiconductor device 1 includes the wiring boards 12c, 12b, and 12e of the insulated circuit board 10, the semiconductor chip 15, the external connection terminals 23 and 25, and the wire 27. Furthermore, because the wiring boards 12a and 12b are electrically connected by the lead frame 28, the upper arm A and the lower arm B are connected. As a result, the semiconductor device 1 functions as a half-bridge circuit including the upper arm A and the lower arm B.

In this embodiment, a case where the number of the semiconductor chip 14 included in the upper arm A is one and where the number of the semiconductor chip 15 included in the lower arm B is one is described. However, a plurality of semiconductor chips 14 may be included in the upper arm A and a plurality of semiconductor chips 15 may be included in the lower arm B. For example, a plurality of semiconductor chips 14 connected in parallel and a plurality of semiconductor chips connected in parallel may be included. In addition, a semiconductor chip in which the semiconductor chip 14 and an FWD chip are connected in inverse parallel and a semiconductor chip in which the semiconductor chip 15 and an FWD chip are connected in inverse parallel may be included.

(Method for Manufacturing the Semiconductor Device 1)

Figure 5:
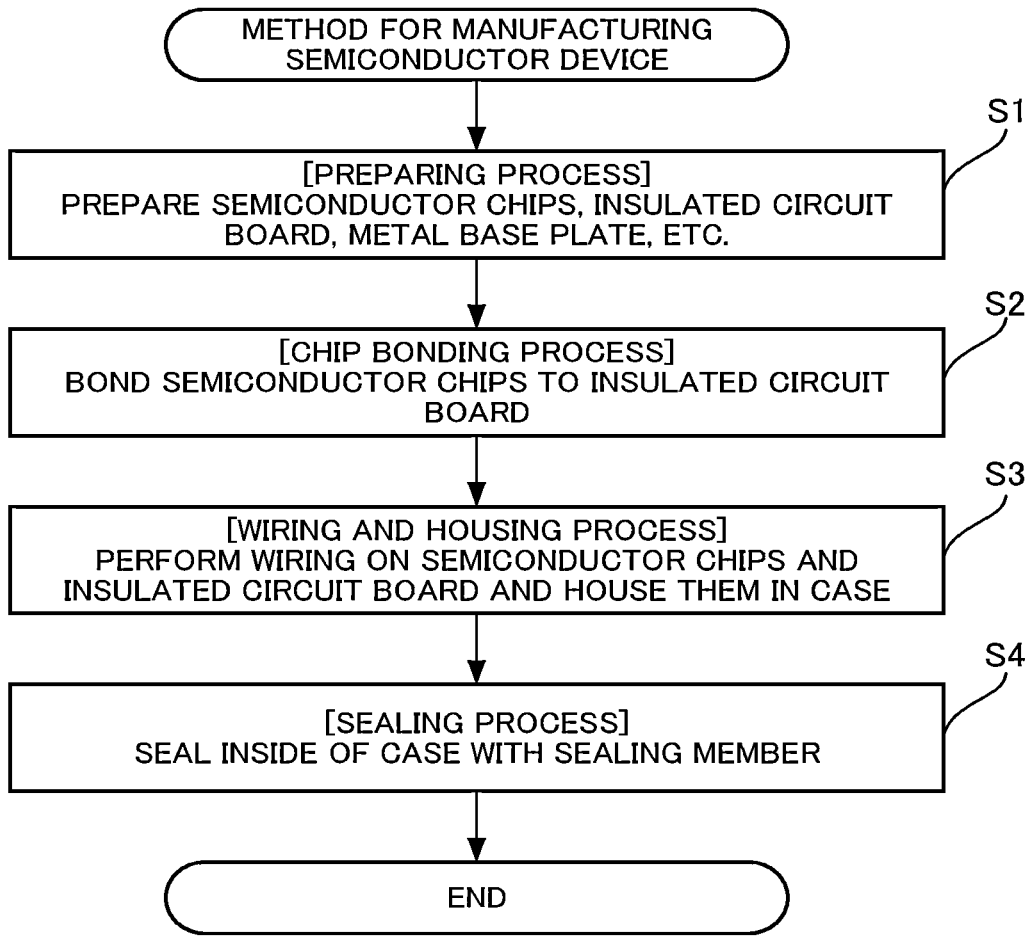
FIG. 5 is a flow chart illustrative of a method for manufacturing the semiconductor device.

Next, a method for manufacturing the semiconductor device 1 will be described with reference to FIG. 5. FIG. 5 is a flow chart illustrative of a method for manufacturing the semiconductor device. First, a preparing process for preparing components of the semiconductor device 1 is performed (step S1 of FIG. 5). The components are the semiconductor chips 14 and 15, the insulated circuit board 10, the metal base plate 3, the case 4, the sealing member 5, the external connection terminals 21 through 25, the lead frames 28 and 29, and the like. Components not described here are also prepared as needed. Furthermore, various manufacturing apparatus used for manufacturing the semiconductor device 1 are also prepared. The manufacturing apparatus are a wire bonding apparatus, a transfer apparatus, a sintering apparatus, a cooling apparatus, and the like. Manufacturing apparatus not described here are also prepared as needed.

Next, a chip bonding process for bonding the semiconductor chips 14 and 15 to the insulated circuit board is performed (step S2 of FIG. 5). The semiconductor chips 14 and 15 are bonded to the wiring boards 12a and 12b, respectively, of the insulated circuit board 10 with the bonding member 16. The details of step S2 of FIG. 5 will be described later with reference to a flow chart of FIG. 6.

Next, a wiring and housing process for performing wiring on the semiconductor chips 14 and 15 and the insulated circuit board 10 and housing the semiconductor chips 14 and 15 and the insulated circuit board 10 in the case 4 is performed (step S3 of FIG. 5). The lower end portions of the external connection terminals 21 through 25 are bonded to the wiring boards 12a through 12e, respectively, of the insulated circuit board 10 with a bonding member, such as solder, or by ultrasonic bonding. Furthermore, the one end portion and the other end portion of the lead frame 28 are bonded to the output electrode 14b of the semiconductor chip 14 and the wiring board 12b, respectively. The one end portion and the other end portion of the lead frame 29 are bonded to the output electrode 15b of the semiconductor chip 15 and the wiring board 12c, respectively. Furthermore, the wiring boards 12d and 12e and the control electrodes 14a and 15a of the semiconductor chips 14 and 15 are connected by the wires 26 and 27, respectively. These bonding operations may be performed in any order.

The insulated circuit board 10 including the semiconductor chips 14 and 15 on which wiring is performed in this way is bonded to a central portion of the front surface of the metal base plate 3 with the bonding member 3a therebetween. The case 4 which circularly continues over the periphery of the insulated circuit board 10 is bonded to the front surface of the metal base plate 3 with the adhesive member 4a therebetween. The periphery of the insulated circuit board 10 is surrounded by the case 4 and the insulated circuit board 10 is housed in the case 4.

Next, a sealing process for sealing the inside of the case 4 with the sealing member 5 is performed (step S4 of FIG. 5). The inside of the case 4 is filled with the sealing member 5. An area surrounded by the front surface of the metal base plate 3 and the case 4 is filled with the sealing member 5. As a result, the insulated circuit board 10, the semiconductor chips 14 and 15, the one end portions of the external connection terminals 21 through 25, the wires 26 and 27, and the lead frames 28 and 29 are sealed. By performing the above steps, the semiconductor device 1 illustrated in FIG. 1 and FIG. 2 is obtained.

Figure 6:
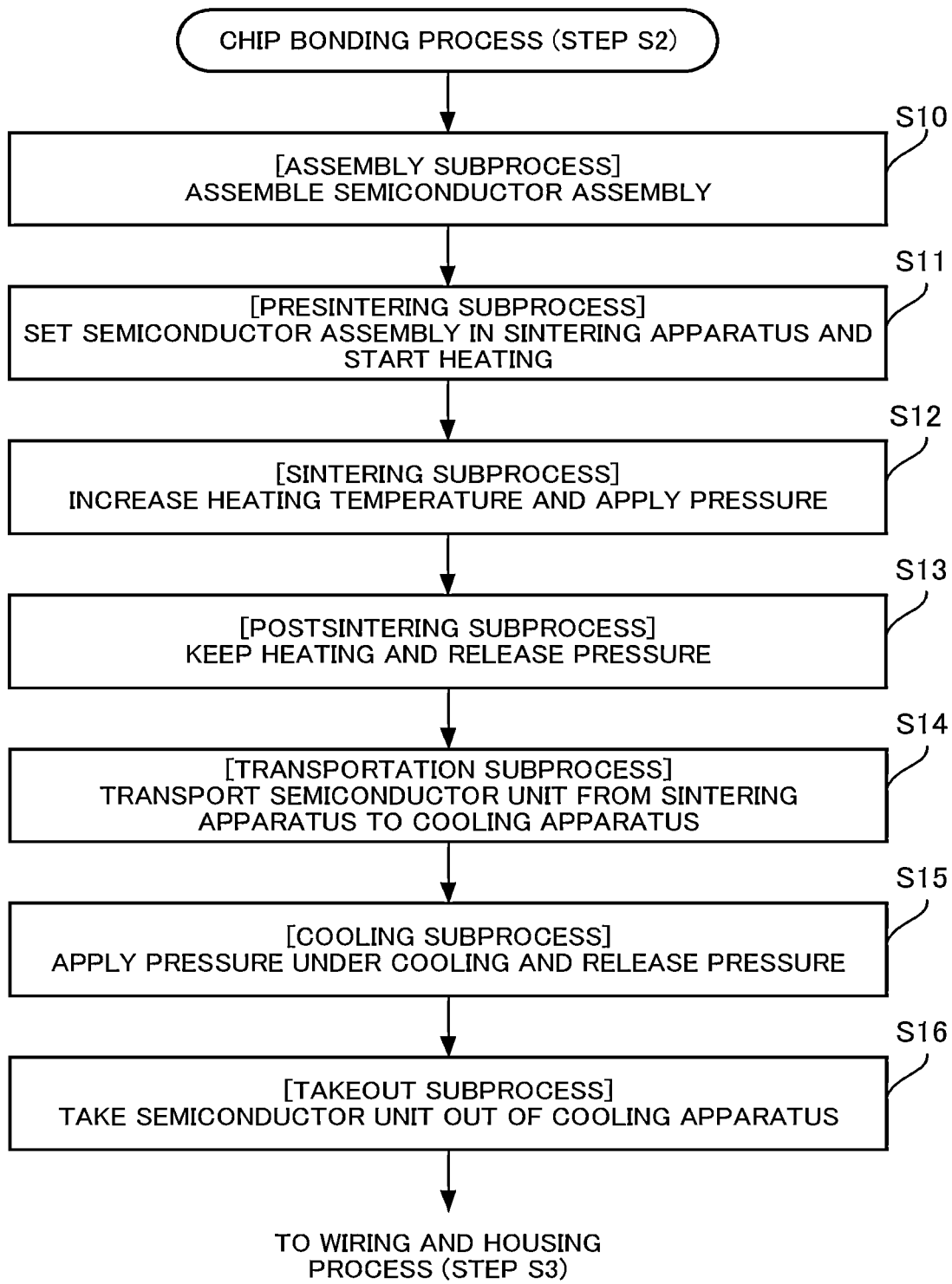
FIG. 6 is a flow chart illustrative of a chip bonding process according to a first embodiment included in the method for manufacturing the semiconductor device.
Figure 7:
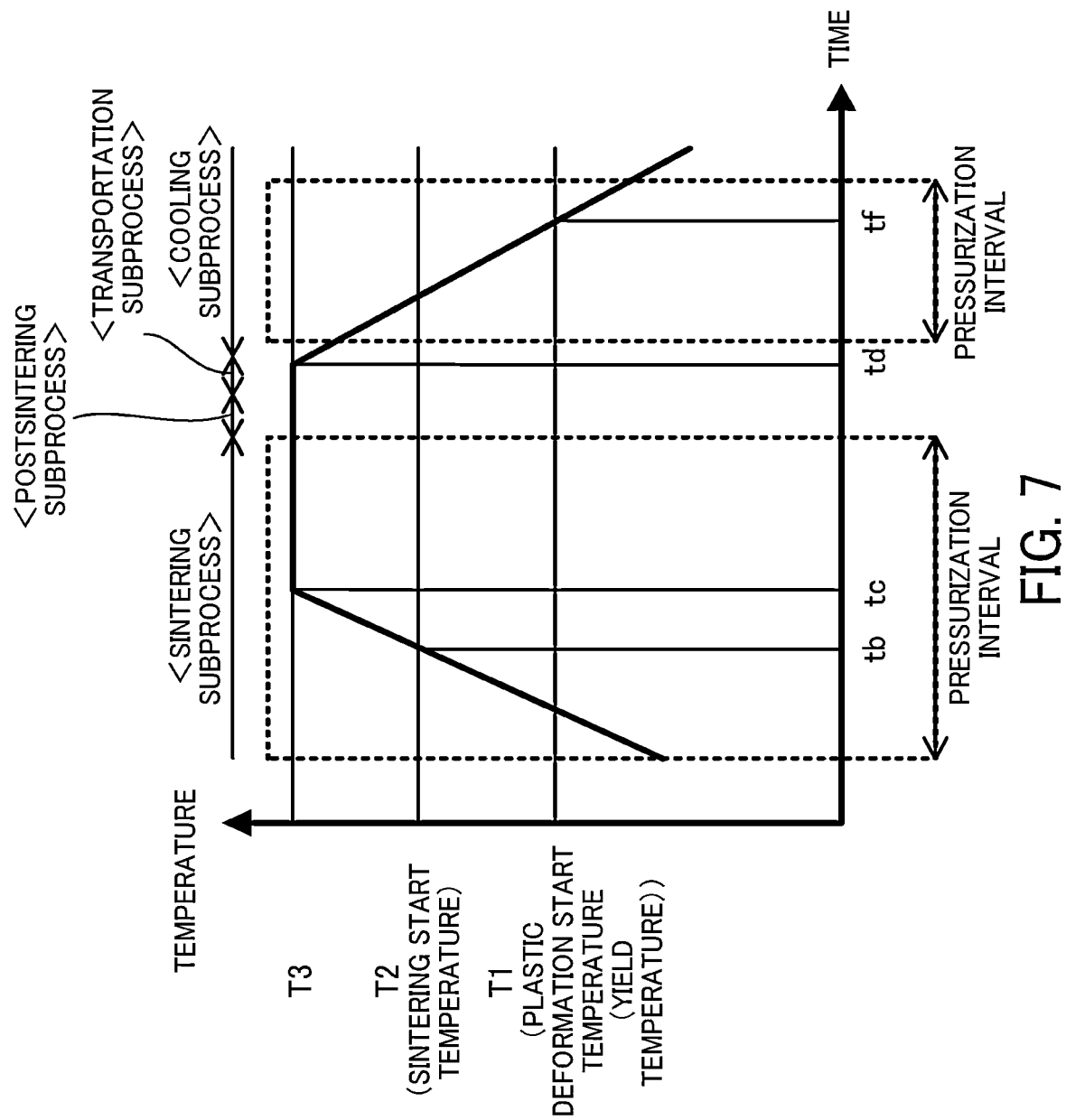
FIG. 7 is a graph indicative of a change in the temperature of the semiconductor unit in the chip bonding process according to the first embodiment.

The chip bonding process performed in step S2 included in the method for manufacturing the semiconductor device 1 illustrated in FIG. 5 will now be described with reference to FIG. 6 and FIG. 7. FIG. 6 is a flow chart illustrative of the chip bonding process according to a first embodiment included in the method for manufacturing the semiconductor device. FIG. 7 is a graph indicative of a change in the temperature of the semiconductor unit in the chip bonding process according to the first embodiment. In FIG. 7, a horizontal axis indicates time and a vertical axis indicates the temperature of the semiconductor unit 2. Furthermore, FIG. 7 indicates a change in the temperature of the semiconductor unit 2 from a sintering subprocess to a cooling subprocess.

Figure 8A:
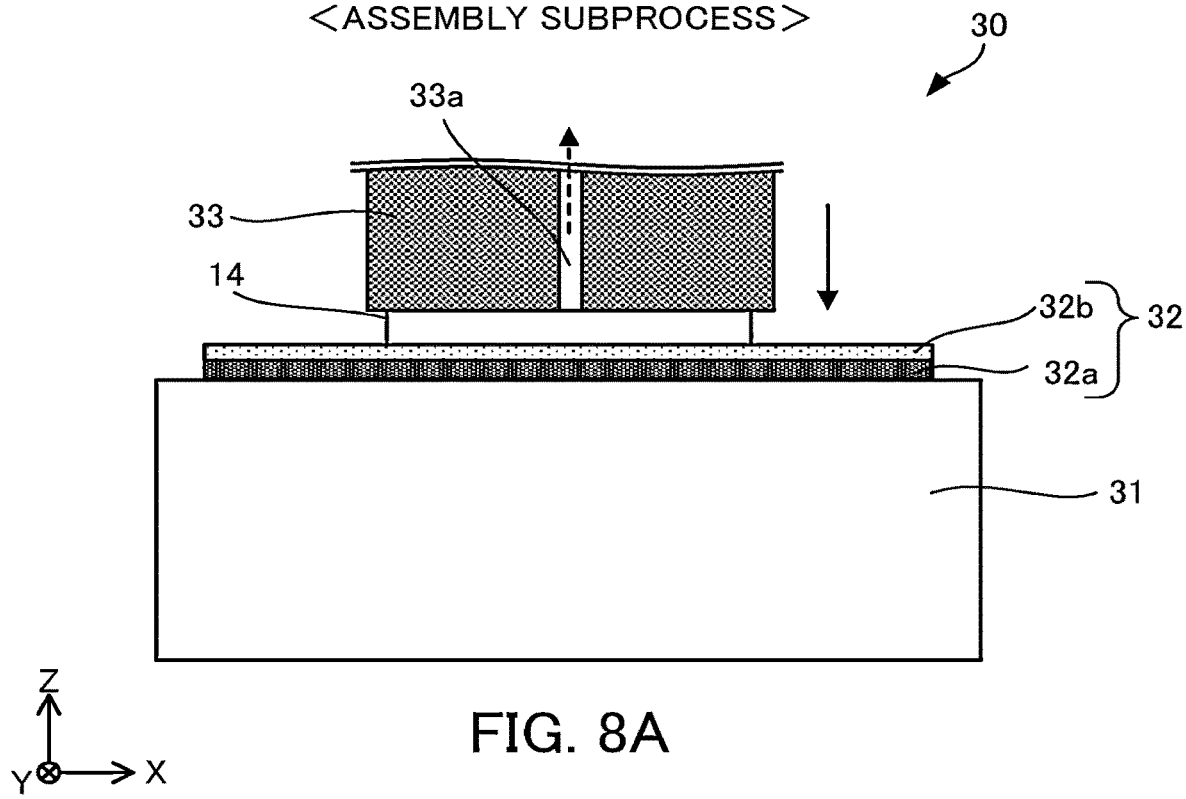
FIGS. 8A and 8B illustrate an assembly subprocess included in the chip bonding process according to the first embodiment (part 1)
Figure 8B:
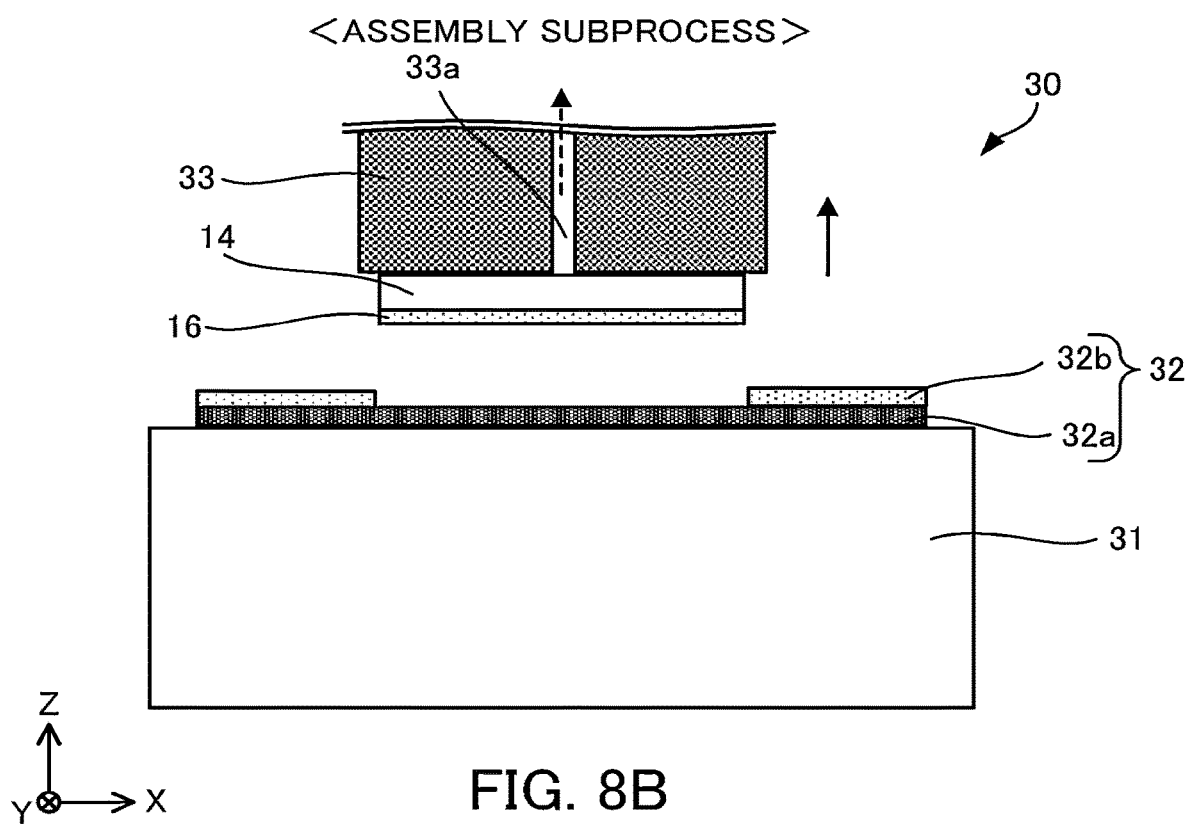
Figure 9:
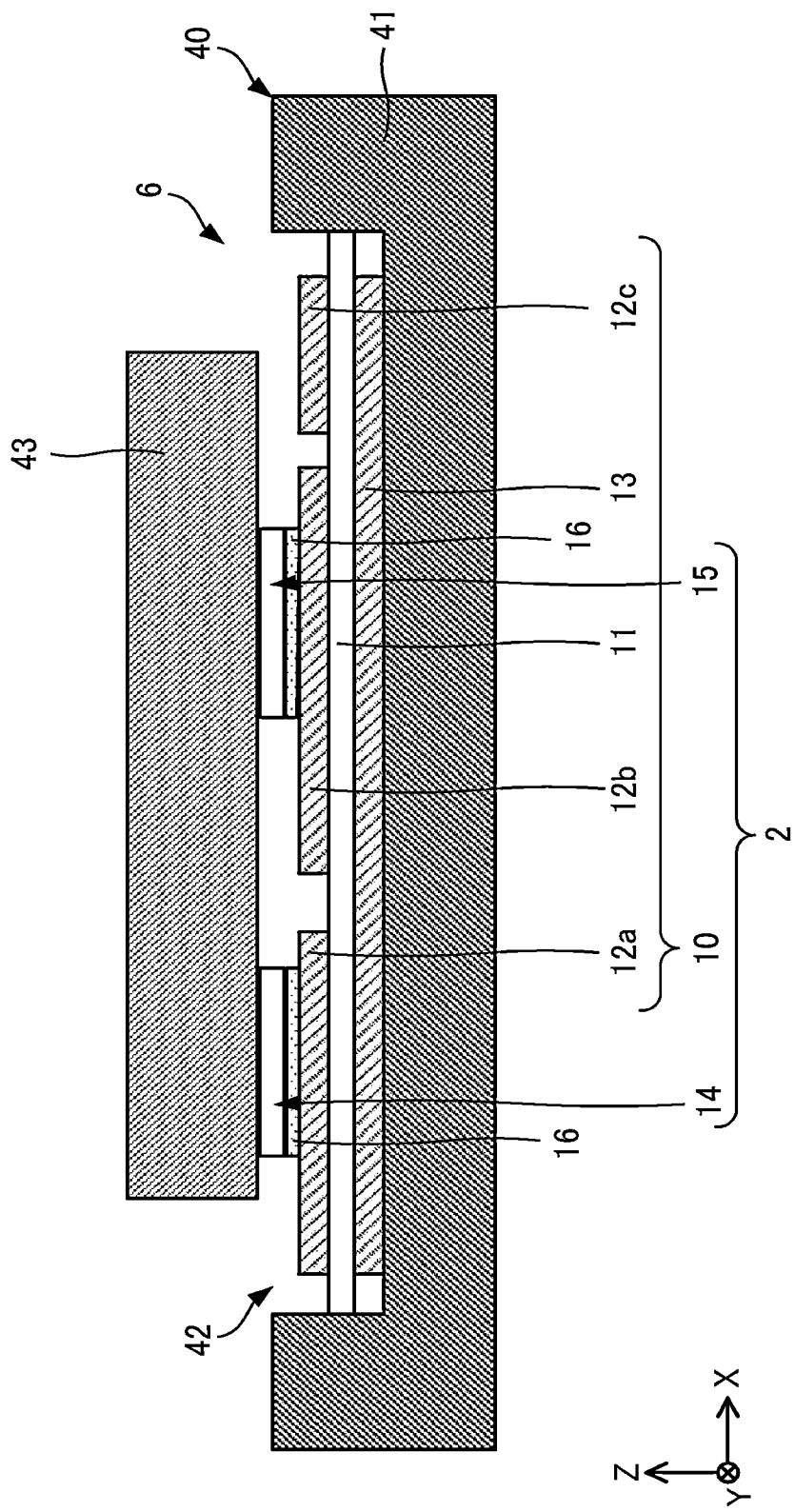
FIG. 9 illustrates an assembly subprocess included in the chip bonding process according to the first embodiment (part 2)

First, an assembly subprocess for assembling a semiconductor assembly 6 by arranging the semiconductor chips 14 and 15 over determined areas of the wiring boards 12a and 12b, respectively, of the insulated circuit board 10 is performed (step S10 of FIG. 6). The assembly subprocess will now be described with reference to FIGS. 8A and 8B and FIG. 9. FIGS. 8A and 8B and FIG. 9 illustrate the assembly subprocess included in the chip bonding process according to the first embodiment. FIG. 8A illustrates pressing the semiconductor chip 14 against a sintered sheet 32. FIG. 8B illustrates pulling up the semiconductor chip 14 from the sintered sheet 32. In the assembly subprocess, first, the bonding member 16 is attached to the back surfaces of the semiconductor chips 14 and 15 by transfer. This transfer is performed by the use of a transfer apparatus 30 illustrated in FIGS. 8A and 8B. FIGS. 8A and 8B simply illustrate the semiconductor chip 14 as an example. With the semiconductor chip 15, transfer is performed in the same way.

As illustrated in FIGS. 8A and 8B, the transfer apparatus 30 includes a transfer stand 31 and a transfer tool 33. The sintered sheet 32 is placed on the transfer stand 31. The transfer tool 33 has a vacuum suction hole 33a at the center and sucks the front surface (output electrode side) of the semiconductor chip 14. Furthermore, the transfer tool 33 carries the semiconductor chip 14 right over the transfer stand 31.

The sintered sheet 32 is placed on the transfer stand 31 of the transfer apparatus 30 having the above structure. The sintered sheet 32 includes a release film 32a and a sintered material film 32b formed on one principal plane of the release film 32a. The sintered material film 32b contains metal which becomes the bonding member 16 after sintering. For example, the sintered material film 32b contains silver particles having diameters greater than or equal to 1 nm and smaller than or equal to 100 nm and resin. The sintered sheet 32 is placed on the transfer stand 31 so that the sintered material film 32b will face upward. The sintered sheet 32 is fixed onto the transfer stand 31 by the release film 32a.

Next, the transfer tool 33 sucks and picks up the semiconductor chip 14. At this time, the semiconductor chip 14 is picked up in a state in which the back surface (input electrode side) faces downward. Specifically, first, the transfer tool 33 which carries the semiconductor chip 14 moves right over the transfer stand 31. Next, the transfer tool 33 moves downward to the transfer stand 31 and presses the semiconductor chip 14 against the sintered sheet 32 on the transfer stand 31 (FIG. 8A). As a result, the back surface (input electrode side) of the semiconductor chip 14 is pressed against the sintered material film 32b of the sintered sheet 32. After that, the transfer tool 33 moves upward and returns to a position right over the transfer stand 31. At this time, the bonding member 16 which is sintered metal is transferred from the sintered material film 32b of the sintered sheet 32 to the back surface of the semiconductor chip 14.

As illustrated in FIG. 9, the insulated circuit board 10 is placed on a positioning jig 40. The positioning jig 40 includes a body portion 41 and a positioning area 42 formed in the body portion 41. The body portion 41 contains as a main ingredient a material, such as carbon or a ceramic, having a low linear expansion coefficient. The body portion 41 has the shape of a flat plate. The positioning area 42 is rectangular in plan view and is a concave recess formed in the front surface of the body portion 41. The bottom of the positioning area 42 is approximately parallel to the front surface of the body portion 41. The external shape of the positioning area 42 corresponds to the external shape of the insulated circuit board 10. The depth of the positioning area 42 may be equal to or slightly greater than the thickness of the insulated circuit board 10.

The semiconductor chips 14 and 15 to which the bonding member 16 is transferred are placed with the side of the bonding member 16 down on the wiring boards 12a and 12b, respectively, of the insulated circuit board 10 placed in the positioning area 42 of the positioning jig 40. Furthermore, as illustrated in FIG. 9, a buffer material 43 is placed on the semiconductor chips 14 and 15. The buffer material 43 is a material, such as a carbon sheet, having an elastic modulus lower than that of the semiconductor chips 14 and 15 and a pressurizer 7b. The semiconductor assembly 6 is obtained in this way. That is to say, the semiconductor assembly 6 includes the positioning jig 40, the insulated circuit board 10, and the semiconductor chips 14 and 15 placed over the wiring boards 12a and 12b, respectively, of the insulated circuit board 10 with the bonding member 16 therebetween.

Figure 10:
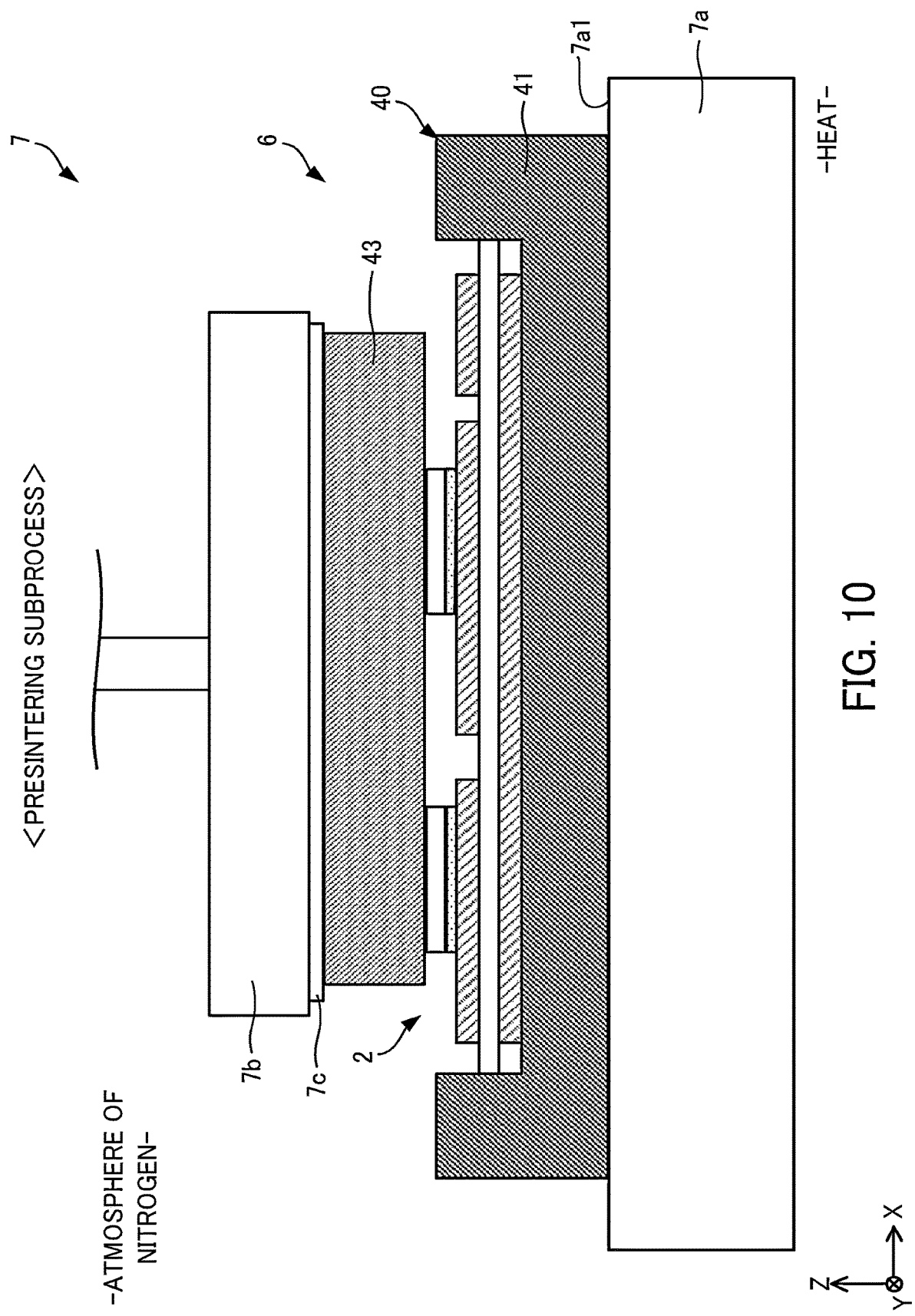
FIG. 10 illustrates a presintering subprocess included in the chip bonding process according to the first embodiment.

Next, a presintering subprocess for setting the semiconductor assembly 6 on which the buffer material 43 is placed in a sintering apparatus 7 and starting heating is performed (step S11 of FIG. 6). The presintering subprocess will now be described with reference to FIG. 10. FIG. 10 illustrates the presintering subprocess included in the chip bonding process according to the first embodiment. The semiconductor assembly 6 obtained in step S10 is carried in the sintering apparatus 7.

The sintering apparatus 7 includes in a chamber (not illustrated) a heater 7a and the pressurizer 7b included in the heater 7a and placed opposite the heater 7a. The heater 7a includes a heating surface 7a1 on which the semiconductor assembly 6 is placed. The temperature of the heating surface 7a1 is increased and decreased by the heater 7a at a determined heating speed. The heating surface 7a1 is substantially flat and may include warp or undulation caused by heating, pressurization, or impact from the outside. The flatness of the heating surface 7a1 is 0.05 mm or less. The flatness of the heating surface 7a1 is preferably 0.02 mm or less. The pressurizer 7b is situated right over the heating surface 7a1. The pressurizer 7b approaches the heating surface 7a1 and applies determined pressure to an object to be pressurized or separates from the heating surface 7a1 and releases the pressure applied to the object to be heated. The heating, the pressurization, and filling the chamber with nitrogen and discharging nitrogen from the chamber described later are controlled by a controller (not illustrated) included in the sintering apparatus 7.

The semiconductor assembly 6 obtained in step S10 is placed on the heating surface 7a1 of the heater 7a of the sintering apparatus 7. The pressurizer 7b is set over the buffer material 43 on the semiconductor assembly 6 with a protection sheet 7c therebetween. The protection sheet 7c is used for protecting the buffer material 43 from direct contact with the pressurizer 7b. For example, the protection sheet 7c contains polyimide resin as a main ingredient. After setting is performed in this way, the inside of the chamber is considered to be at room temperature and in an air atmosphere. Furthermore, filling the chamber with nitrogen is begun and heating by the heater 7a is begun.

Figure 11:
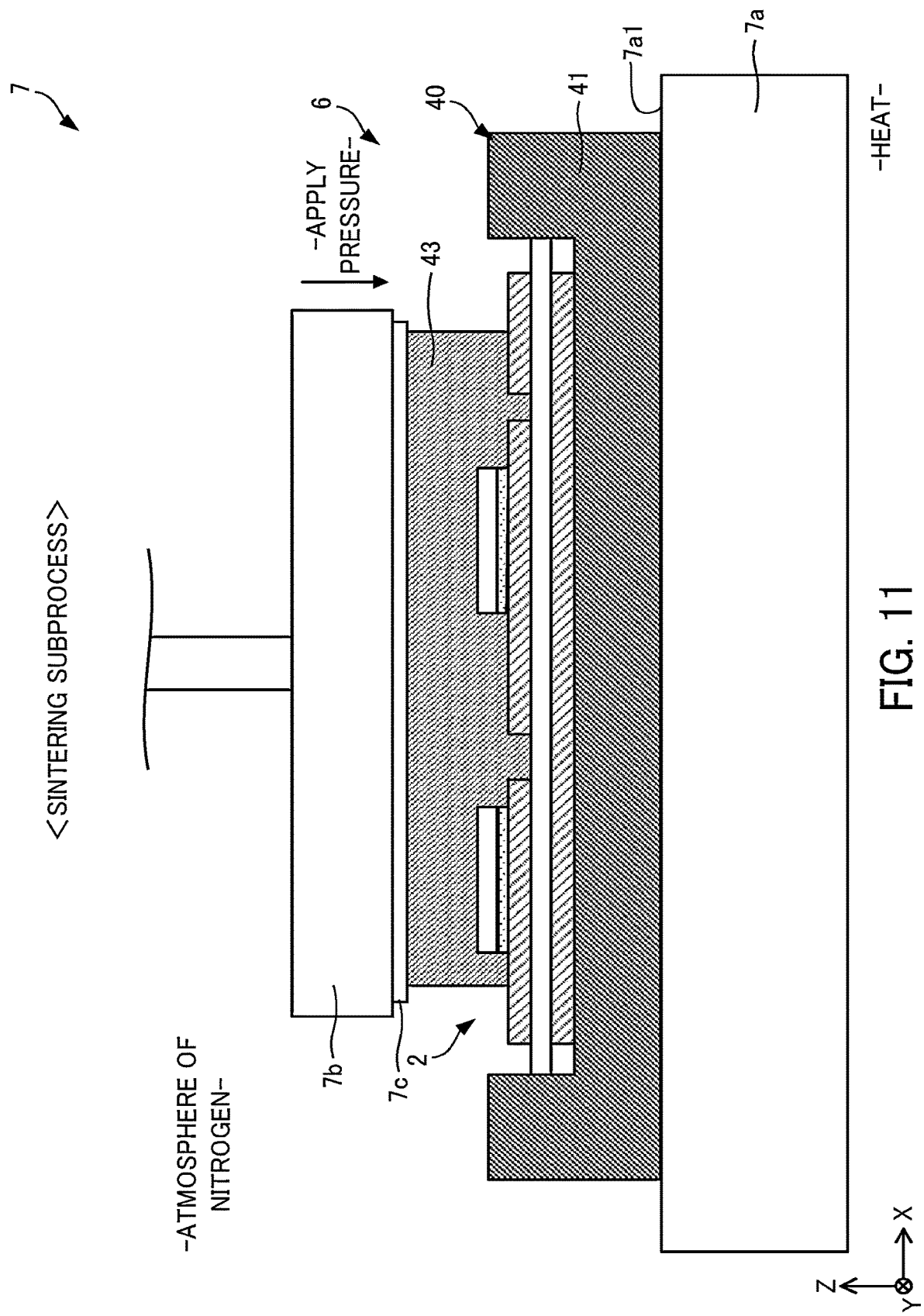
FIG. 11 illustrates a sintering subprocess included in the chip bonding process according to the first embodiment.

Next, a sintering subprocess for applying pressure to the semiconductor assembly 6 while increasing heating temperature by the heater 7a is performed (step S12 of FIG. 6). The sintering subprocess will now be described with reference to FIG. 11. FIG. 11 illustrates the sintering subprocess included in the chip bonding process according to the first embodiment.

As indicated by <sintering subprocess> in FIG. 7, the temperature of the semiconductor assembly 6 (semiconductor unit 2) rises by heating the heater 7a. In addition, the pressurizer 7b is brought near the heater 7a and constant pressure is applied via the buffer material 43 to the semiconductor assembly 6 in the −Z direction. This application of the constant pressure is begun before the elapse of time tb at which a temperature T2, which is a sintering start temperature of the bonding member 16, is reached. Furthermore, this application of the constant pressure is maintained during the sintering subprocess. As a result, as illustrated in FIG. 11, the buffer material 43 deforms and fits to the entire surface on the front surface side of the wiring boards 12a through 12e of the insulated circuit board and the semiconductor chips 14 and 15. Accordingly, the semiconductor chips 14 and 15 are uniformly pressed in the −Z direction. For example, the pressure applied at this time is higher than or equal to 0.1 ton and lower than or equal to 2 tons.

When the determined time tb elapses after the heating is begun, the temperature of the semiconductor assembly 6 reaches the temperature T2, which is the sintering start temperature of the bonding member 16, and sintering of the bonding member 16 to which the pressure is applied begins. For example, if the bonding member 16 contains silver or a silver alloy as a main ingredient, then the temperature T2 is higher than or equal to 100° C. and lower than or equal to 300° C.

The heater 7a is heated further. When a determined time tc (>tb) elapses after the heating is begun, the temperature of the semiconductor assembly 6 reaches a determined temperature T3. The temperature T3 is kept for a determined time. The temperature T3 is higher than the temperature T2. For example, if the bonding member 16 contains silver or a silver alloy as a main ingredient, then the temperature T3 is higher than or equal to 200° C. and lower than or equal to 400° C. The sintering of the bonding member 16 to which the pressure is applied progresses for this time and the semiconductor chips 14 and 15 are bonded to the wiring boards 12a and 12b, respectively, of the insulated circuit board 10.

Figure 12:
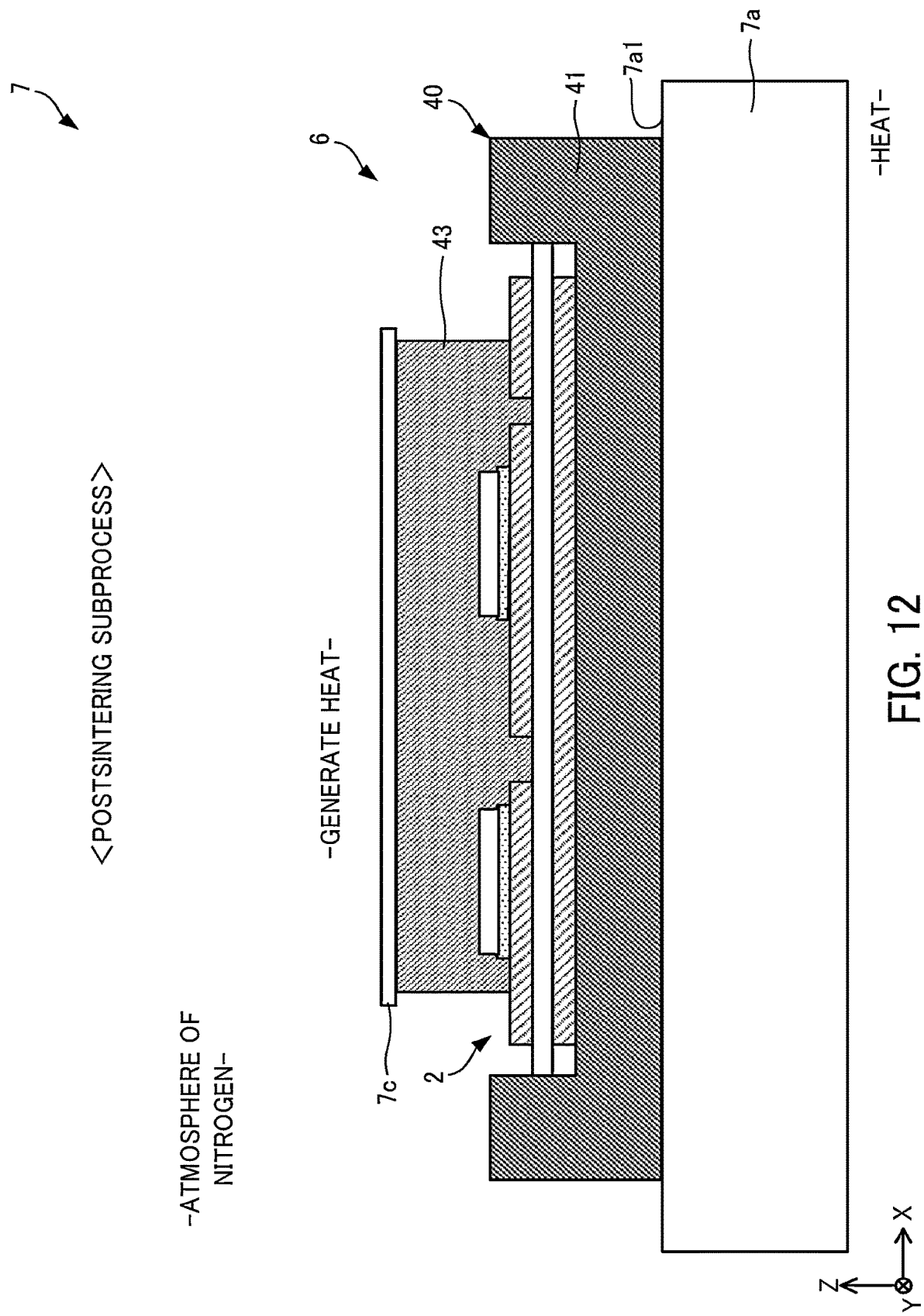
FIG. 12 illustrates a postsintering subprocess included in the chip bonding process according to the first embodiment.

Next, a postsintering subprocess for keeping heating the semiconductor assembly 6 and releasing the pressure is performed (step S13 of FIG. 6). The postsintering subprocess will now be described with reference to FIG. 12. FIG. 12 illustrates the postsintering subprocess included in the chip bonding process according to the first embodiment.

Heating by the heater 7a is kept and temperature in the chamber which is in an atmosphere of nitrogen is kept at the temperature T3. Furthermore, the pressurizer 7b is separated from the heater 7a so as to be situated right over the heater 7a and the pressure applied to the semiconductor assembly 6 is released. The buffer material 43 and the protection sheet 7c may be located over the semiconductor assembly 6. The buffer material 43 is preferably located over the semiconductor assembly 6. By locating the buffer material 43 over the semiconductor assembly 6, a drop in the temperature of the semiconductor assembly 6 in a transportation subprocess performed later is suppressed. In addition, by locating the protection sheet 7c over the semiconductor assembly 6, adhesion of dirt or dust to the semiconductor assembly 6 or the buffer material 43 in the transportation subprocess performed later is suppressed. At this time, as illustrated in FIG. 12, the semiconductor assembly 6 generates heat and the temperature of the semiconductor assembly 6 is the temperature T3. That is to say, the temperature of the positioning jig 40, the insulated circuit board 10, and the semiconductor chips 14 and is the temperature T3.

Figure 13:
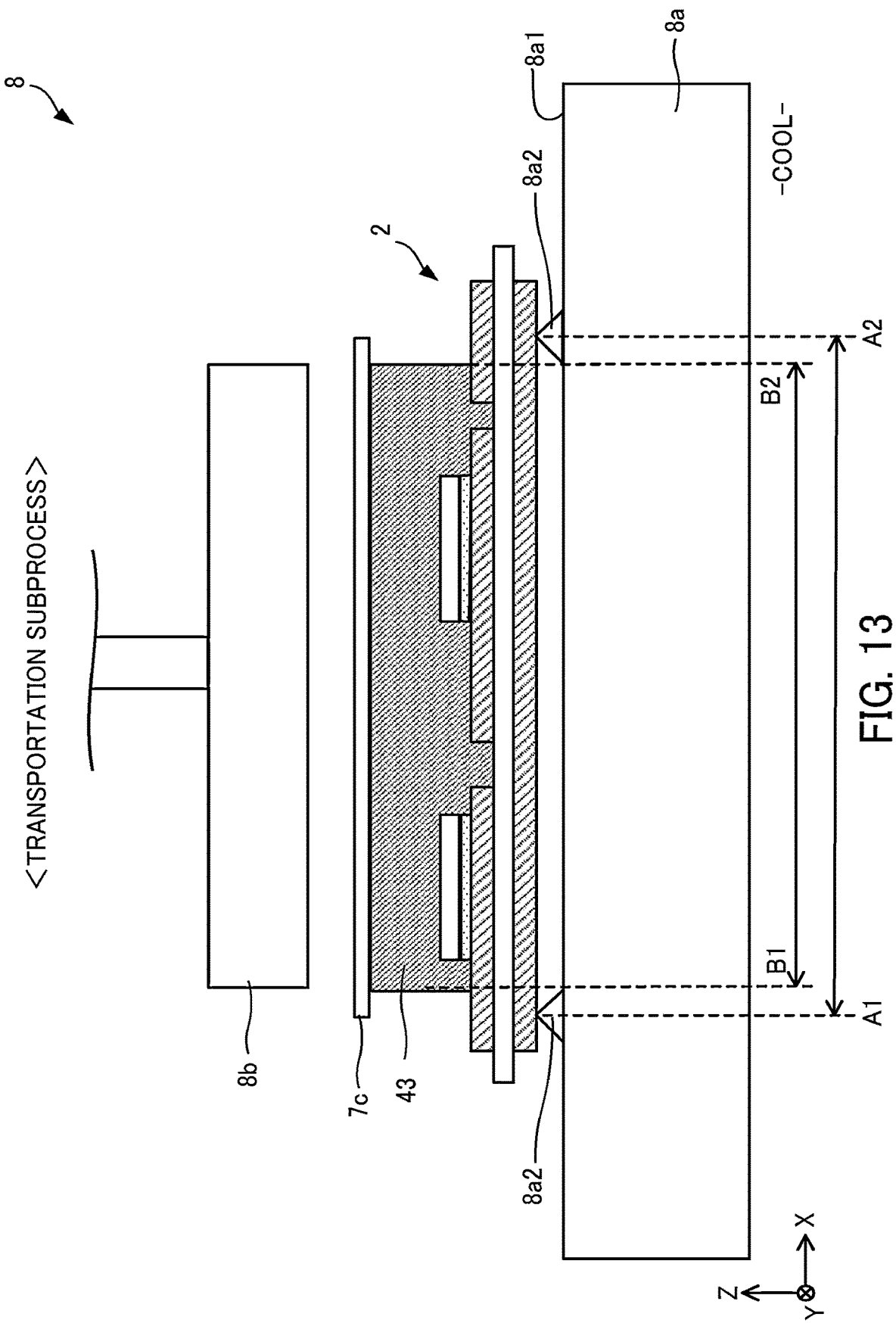
FIG. 13 illustrates a transportation subprocess included in the chip bonding process according to the first embodiment (part 1)
Figure 14:
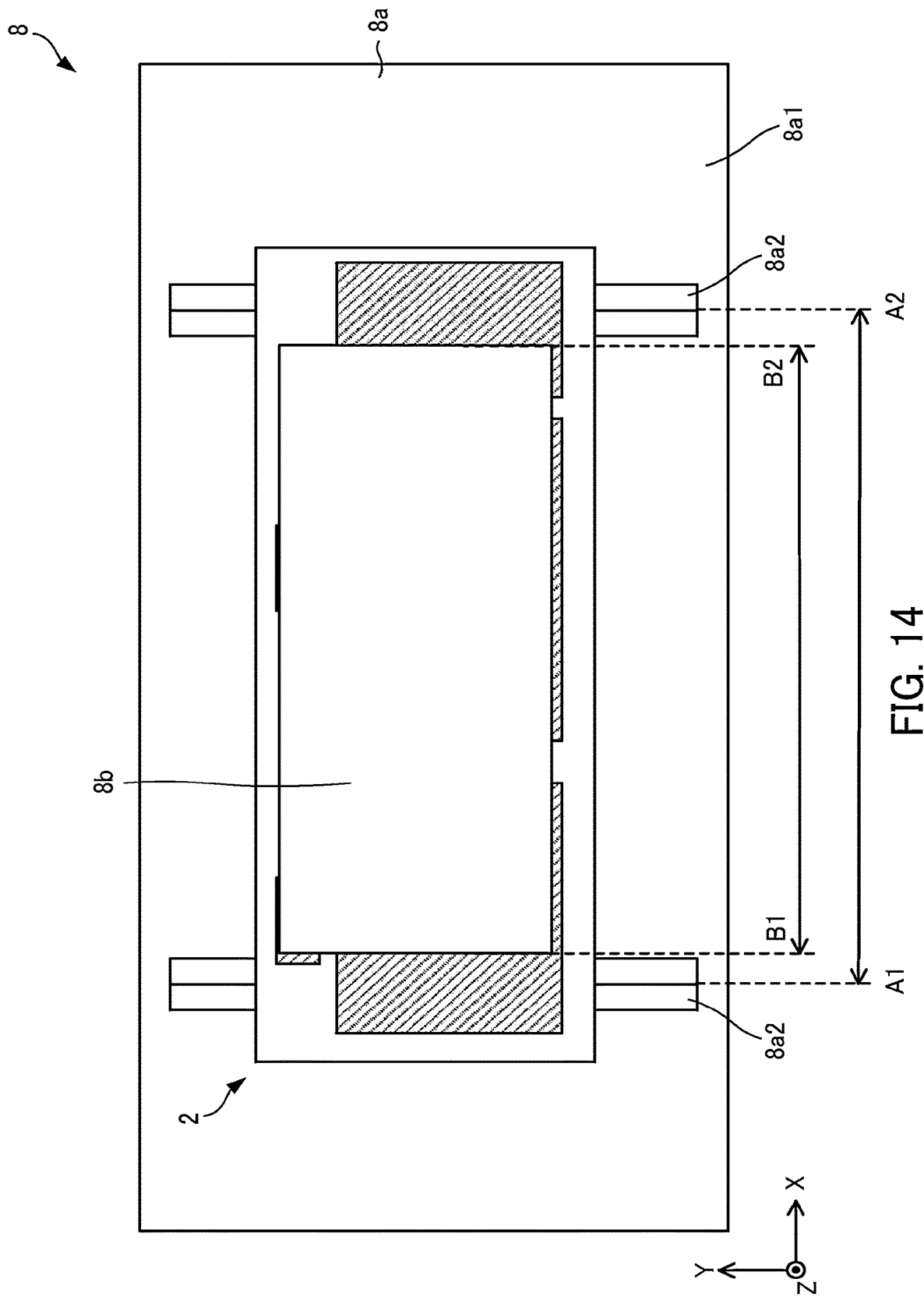
FIG. 14 illustrates a transportation subprocess included in the chip bonding process according to the first embodiment (part 2)

Next, the transportation subprocess for transporting the semiconductor unit 2 included in the semiconductor assembly 6 from the sintering apparatus 7 to a cooling apparatus 8 is performed (step S14 of FIG. 6). The transportation subprocess will now be described with reference to FIG. 13 and FIG. 14. FIG. 13 and FIG. 14 illustrate the transportation subprocess included in the chip bonding process according to the first embodiment. FIG. 14 is a top view of the cooling apparatus 8 of FIG. 13 on which the semiconductor unit 2 is set. However, a pressurizer 8b described later is not illustrated.

After the pressure applied to the semiconductor assembly 6 is released in the sintering apparatus 7, the semiconductor unit 2 which is generating heat is transported to the cooling apparatus 8. The cooling apparatus 8 includes in a chamber (not illustrated) a cooler 8a and the pressurizer 8b located opposite the cooler 8a.

The cooler 8a includes a cooling surface 8a1 and support portions 8a2 formed on the cooling surface 8a1. The semiconductor unit 2 is placed over the cooling surface 8a1. The cooling surface 8a1 is cooled by the cooler 8a at a determined cooling speed. The cooling surface 8a1 is substantially flat and may include warp or undulation caused by cooling, pressurization, or the like. The flatness of the cooling surface 8a1 is 0.2 mm or less. The flatness of the cooling surface 8a1 is preferably 0.1 mm or less.

Each support portion 8a2 has in plan view the shape of a pole continuously extending straight. The support portions 8a2 are formed on the cooling surface 8a1. A section of each support portion 8a2 is convex with respect to the cooling surface 8a1. For example, a section of each support portion 8a2 may be triangular, square, or semicircular. FIG. 13 and FIG. 14 illustrate a case where a section of each support portion 8a2 is triangular. A section of each support portion 8a2 may have the shape of a regular triangle or an isosceles triangle.

Furthermore, the support portions 8a2 are formed in positions in which, when the insulated circuit board 10 is placed over the cooling surface 8a1, the support portions 8a2 support the pair of outer regions of the insulated circuit board 10. In the case of FIG. 13 and FIG. 14, the support portions 8a2 are parallel to each other and are longer than the pair of short sides of the insulated circuit board 10. In addition, as described later, the height of the support portions 8a2 from the cooling surface 8a1 to sides of the support portions 8a2 on which the insulated circuit board 10 is supported is such that the insulated circuit board 10 to which pressure is applied sufficiently warps. If this height is too small, then the insulated circuit board 10 does not sufficiently warp. It is assumed that positions of the sides of the support portions 8a2 are positions A1 and A2 (see FIG. 13 and FIG. 14).

Figure 15:
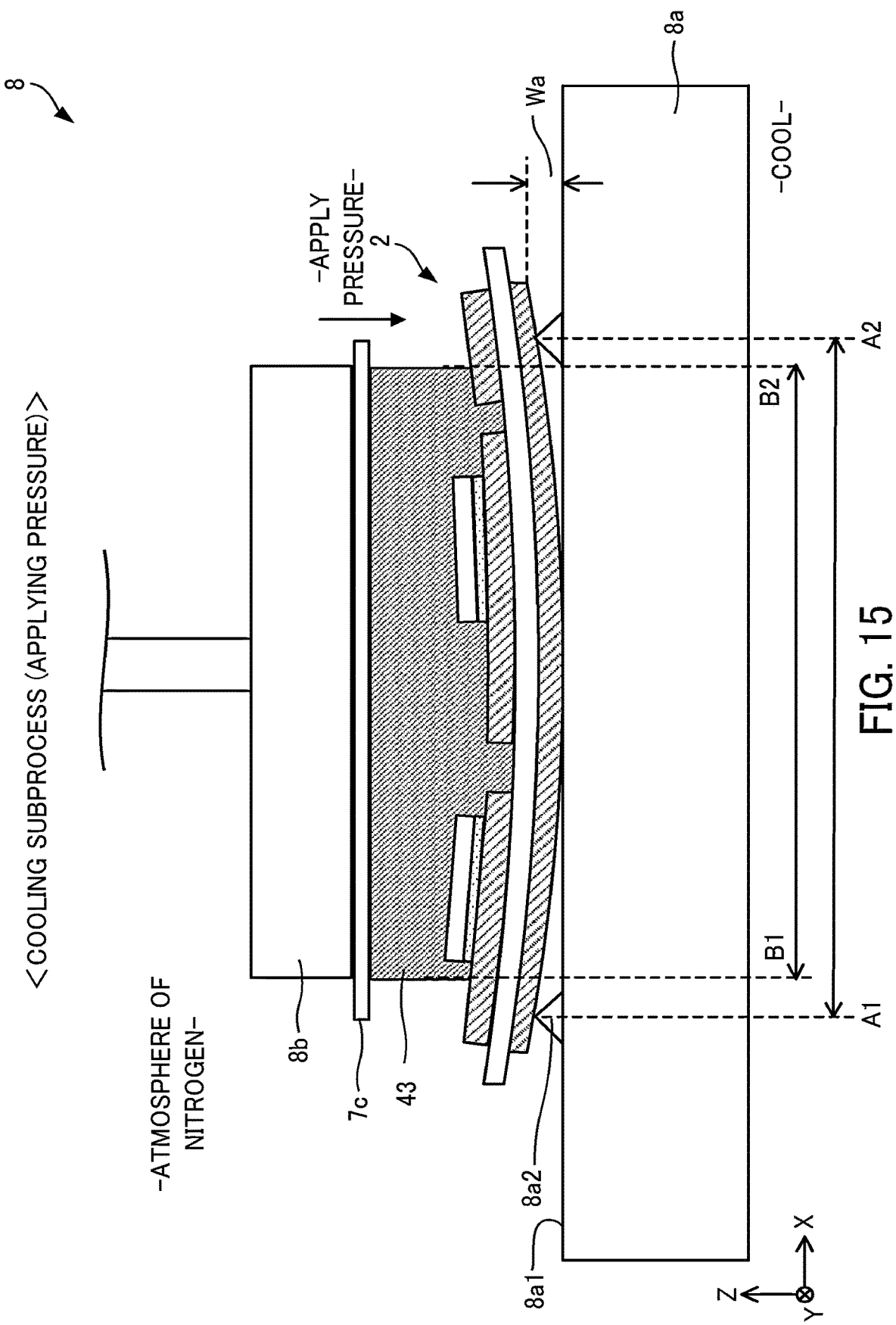
FIG. 15 illustrates a cooling subprocess (applying pressure) included in the chip bonding process according to the first embodiment.

The pressurizer 8b is situated right over the cooling surface 8a1. The pressurizer 8b approaches the cooling surface 8a1 and applies determined pressure to an object to be pressurized or separates from the cooling surface 8a1 and releases the pressure applied to the object to be cooled. In the first embodiment, a case where the pressurizer 8b has a pressurizing surface corresponding to the central region of the insulated circuit board 10 is described. However, another case is possible. That is to say, as illustrated in FIG. 15, there is need for the pressurizer 8b to make the insulated circuit board 10 warp. For example, the pressurizer 8b may have the shape of a pole. In this case, pressure may be applied to a central portion of an upper surface of the semiconductor unit 2 by the pressurizer 8b having the shape of a pole. If at this time, a portion to which pressure is applied includes the semiconductor chip 14 or 15, then pressure may be applied to the insulated circuit board 10 except portions including the semiconductor chip 14 or 15. As illustrated in FIG. 13 and FIG. 14, however, pressure is stably applied to the semiconductor unit 2 by applying pressure to the central region of the insulated circuit board 10. The cooling, the pressurization, and filling the chamber with nitrogen and discharging nitrogen from the chamber are controlled by a controller (not illustrated) included in the cooling apparatus 8.

The semiconductor assembly 6 is taken out of the sintering apparatus 7 and is transported to the cooling apparatus 8. For example, when the semiconductor unit 2 is transported to the cooling apparatus 8, the positioning jig 40 is used as a tray. At this time, the positioning jig 40 has been heated to the determined temperature T3. By transporting the semiconductor unit 2 by the use of the positioning jig 40, the semiconductor unit 2 heated in this way is kept warm until the next cooling subprocess (see <transportation subprocess> in FIG. 7). In the transportation subprocess, the temperature of the semiconductor unit 2 may fall. However, there is need for the temperature of the semiconductor unit 2 to be higher than a plastic deformation start temperature (yield temperature) T1.

The semiconductor unit 2 taken out of the positioning jig 40 is carried in the chamber of the cooling apparatus 8 and is placed over the cooling surface 8a1 of the cooler 8a. At this time, the cooling surface 8a1 of the cooler 8a may be heated in advance to a temperature higher than the plastic deformation start temperature T1. The pair of outer regions (see FIGS. 3A and 3B) of the insulated circuit board placed over the cooling surface 8a1 are supported on the pair of support portions 8a2. The pressurizer 8b is moved over the cooling surface 8a1. As illustrated in FIG. 13 and FIG. 14, the pressurizer 8b presses the semiconductor chips 14 and 15 of the semiconductor unit 2 with the protection sheet 7c and the buffer material 43 therebetween. At this time, the pressurizer 8b is opposed to the central region (see FIGS. 3A and 3B) of the insulated circuit board 10 including the semiconductor chips 14 and 15. It is assumed that positions of both end portions of the pressurizer 8b in the longitudinal direction are positions B1 and B2. When the pressurizer 8b is opposed to the central region of the insulated circuit board 10, the positions B1 and B2 are situated inside the positions A1 and A2, respectively.

Figure 16:
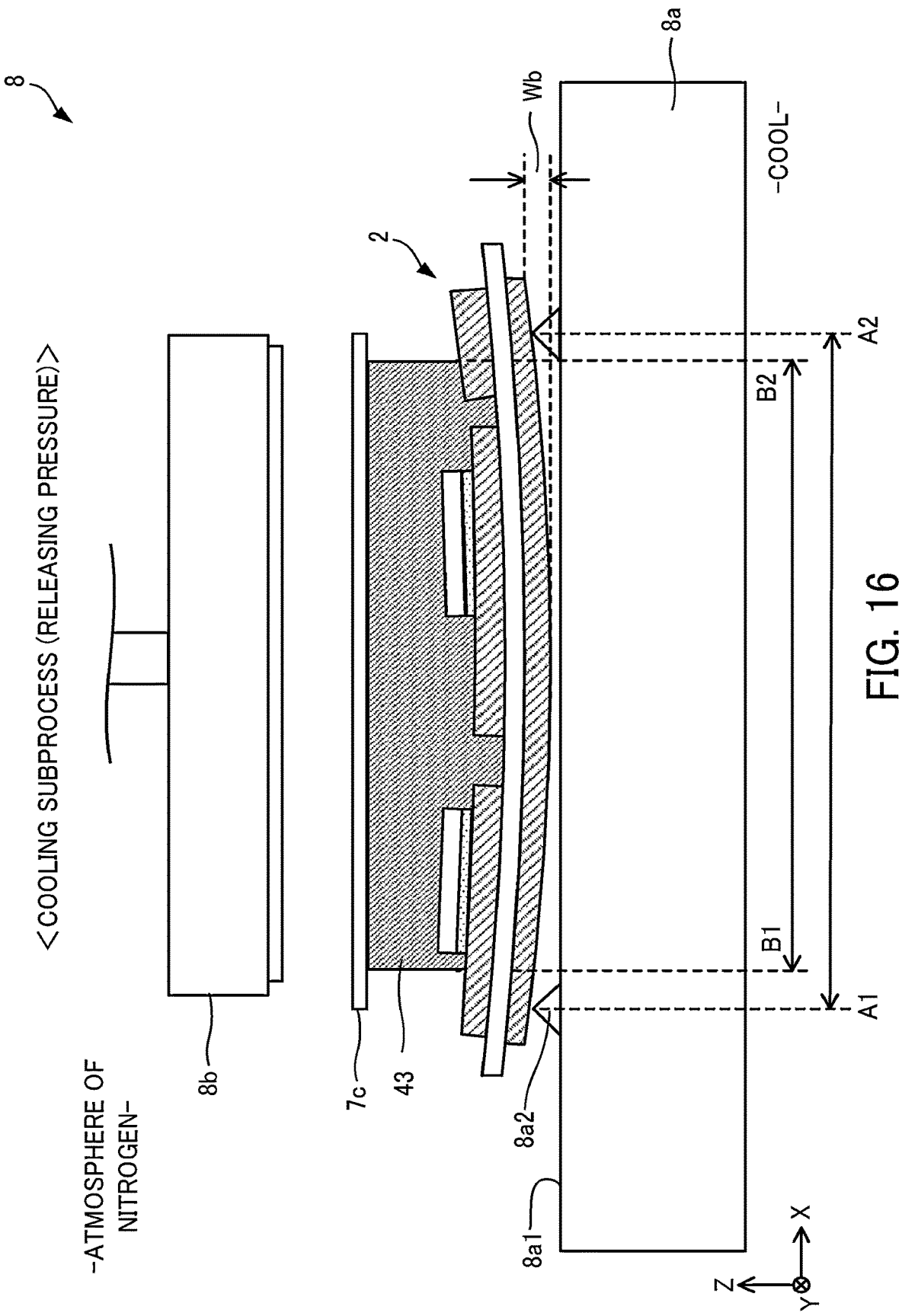
FIG. 16 illustrates the cooling subprocess (releasing the pressure) included in the chip bonding process according to the first embodiment.

Next, a cooling subprocess for applying pressure to the semiconductor unit 2 under cooling is performed (step S15 of FIG. 6). The cooling subprocess will now be described with reference to FIG. 15 and FIG. 16. FIG. 15 illustrates the cooling subprocess (applying pressure) included in the chip bonding process according to the first embodiment. FIG. 16 illustrates the cooling subprocess (releasing the pressure) included in the chip bonding process according to the first embodiment.

The cooler 8a begins cooling the cooling surface 8a1 over which the semiconductor unit 2 is located. The metal plate 13 of the insulated circuit board 10 significantly contracts due to difference in linear expansion coefficient among the insulating plate 11, the wiring boards 12a through 12e, and the metal plate 13. If the insulated circuit board is left as it is, then the insulated circuit board 10 warps with the side of the wiring boards 12a through 12e up and becomes upward convex.

On the other hand, at the same time that the cooling is begun, the pressurizer 8b is moved downward so that the pressurizer 8b will come in contact with the protection sheet 7c which covers the semiconductor chips 14 and 15 with the buffer material 43 therebetween. Furthermore, the semiconductor unit 2 is pressed by the pressurizer 8b in the −Z direction at determined pressure. At this time, the determined pressure is higher than or equal to 0.1 ton and lower than or equal to 2 tons. The pressure applied in the cooling subprocess in step S15 of FIG. 6 is lower than the pressure applied in the sintering subprocess in step S12 of FIG. 6. The back surface of the pair of outer regions of the insulated circuit board 10 is supported on the pair of support portions 8a2 and the front surface of the central region of the insulated circuit board 10 is pressed by the pressurizer 8b in the −Z direction. Accordingly, as illustrated in FIG. 15, the semiconductor unit 2 (insulated circuit board 10) warps and becomes downward convex. At this time, the back surface of the insulated circuit board 10 comes in contact with the cooling surface 8a1. For example, a warp amount at this time is a warp amount Wa. For example, if the insulated circuit board 10 warps and becomes downward convex, then a warp amount is in side view the distance in the vertical direction from a bottom (cooling surface 8a1) with which a convex portion of the insulated circuit board 10 comes in contact to an edge portion of the lower surface (back surface) of the insulated circuit board 10.

Furthermore, the pressure is applied to the semiconductor unit 2 while the semiconductor unit 2 is kept at a temperature higher than the yield temperature T1 at which plastic deformation begins. As a result, plastic deformation occurs. After the pressure is applied to the semiconductor unit 2 by the pressurizer 8b, the pressure applied to the semiconductor unit 2 is released. As illustrated in FIG. 16, a state in which the semiconductor unit 2 (insulated circuit board 10) is warped and downward convex is kept. However, when the pressure applied to the semiconductor unit 2 is released, the state in which the insulated circuit board 10 is warped and downward convex is relaxed in some degree. As a result, a warp amount of the insulated circuit board 10 after releasing the pressure is a warp amount Wb smaller than the warp amount Wa.

Figure 17:
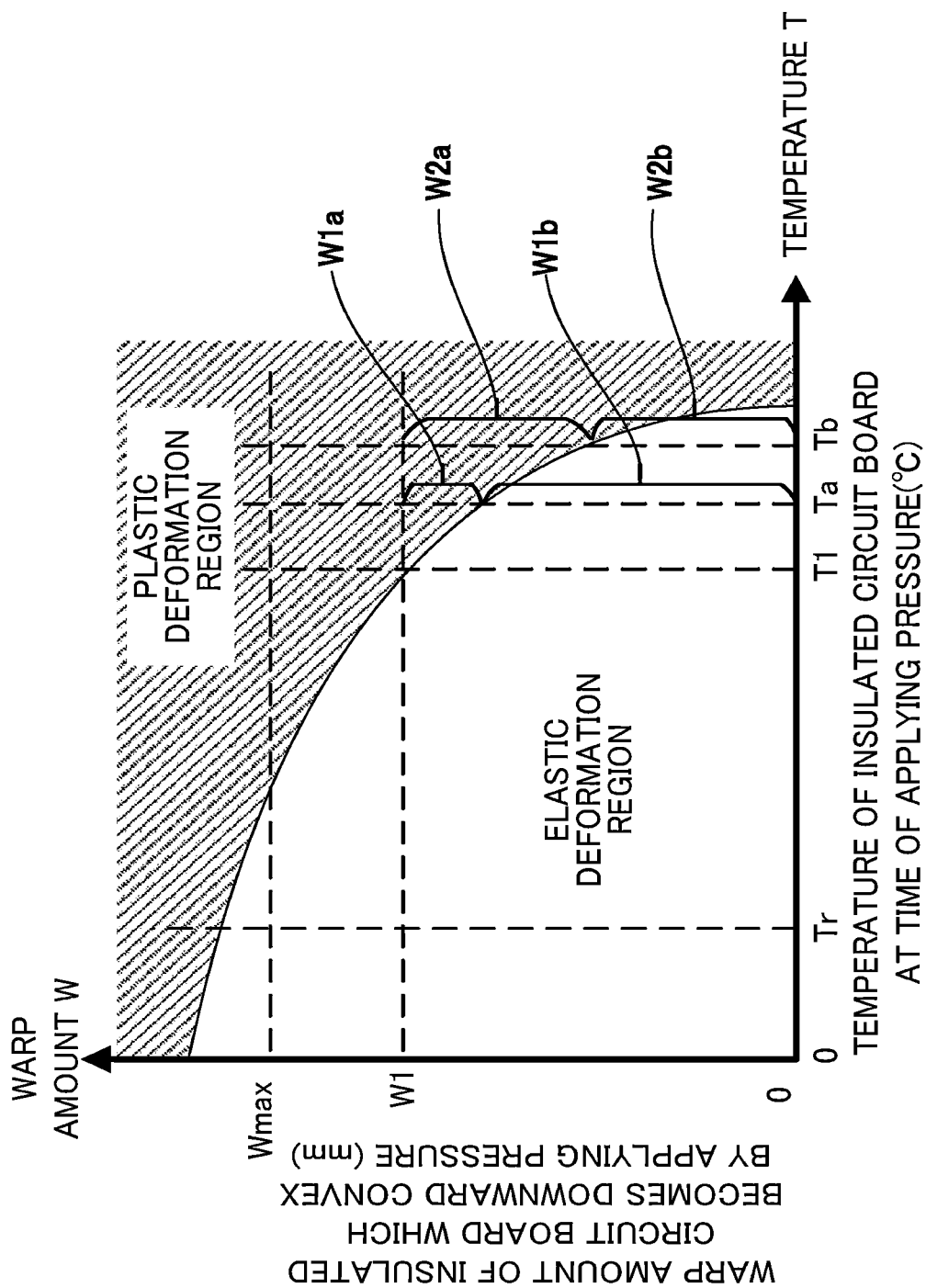
FIG. 17 is a graph indicative of a warp amount of an insulated circuit board caused by applying pressure relative to the temperature of the insulated circuit board in the cooling subprocess included in the chip bonding process according to the first embodiment.

A warp amount of the semiconductor unit 2 (insulated circuit board 10) caused by applying pressure relative to the temperature of the semiconductor unit 2 (insulated circuit board 10) will now be described with reference to FIG. 17. FIG. 17 is a graph indicative of a warp amount of the insulated circuit board caused by applying pressure relative to the temperature of the insulated circuit board in the cooling subprocess included in the chip bonding process according to the first embodiment. In FIG. 17, a horizontal axis indicates the temperature T (° C.) of the insulated circuit board 10 at the time of applying pressure and a vertical axis indicates a warp amount W (mm) of the insulated circuit board 10 which warps and becomes downward convex by applying the pressure.

With the insulated circuit board 10, as illustrated in FIG. 17, there are an elastic deformation region in which elastic deformation occurs and a plastic deformation region in which plastic deformation occurs according to the temperature of the insulated circuit board 10 at the time of applying pressure and a warp amount of the insulated circuit board 10 which warps and becomes downward convex by applying the pressure.

If a warp amount of the insulated circuit board 10 to which pressure is applied exceeds a warp amount Wmax, then the insulated circuit board 10 may be damaged. Accordingly, there is need to make a warp amount of the insulated circuit board 10 equal to or smaller than the warp amount Wmax. For example, the warp amount Wmax (curvature) is larger than or equal to 0.1 mm and smaller than or equal to 1.0 mm. For example, a warp amount W1 (curvature) which does not exceed the warp amount Wmax is preferably larger than or equal to 0.05 mm and smaller than or equal to 0.5 mm.

It is assumed that the temperature of the insulated circuit board 10 is about room temperature Tr. Even if a warp amount of the insulated circuit board 10 is about the warp amount W1, only elastic deformation occurs and the insulated circuit board 10 returns to the original shape. For example, it is assumed that in the cooling subprocess in step S15 of FIG. 6, the insulated circuit board 10 is cooled to about the room temperature Tr, warps, and becomes upward convex. Even if pressure is applied to the insulated circuit board 10 to make the insulated circuit board 10 warp and downward convex, the insulated circuit board 10 returns by releasing the pressure to the original state in which the insulated circuit board 10 is warped and upward convex.

If the temperature of the insulated circuit board becomes higher than the yield temperature T1 at which plastic deformation begins and pressure is applied so as to reach the warp amount W1, then plastic deformation occurs. Accordingly, there may be need to apply pressure to the insulated circuit board 10 having a temperature higher than the yield temperature T1. The yield temperature T1 of the insulated circuit board 10 is, for example, higher than or equal to 100° C. and lower than or equal to 200° C. However, if the temperature of the insulated circuit board 10 is close to the yield temperature T1, then the range of warp amounts of the insulated circuit board 10 in which plastic deformation occurs is narrow. Accordingly, there is need to apply pressure to the insulated circuit board 10 at a temperature higher than the yield temperature T1 so as to reach the warp amount W1.

For example, if the temperature of the insulated circuit board 10 is a temperature Ta higher than the yield temperature T1, then pressure is applied to the insulated circuit board 10 so as to reach the warp amount W1. After the pressure is released, a warp amount W1a, which is a plastic deformation amount, is relaxed with respect to the insulated circuit board 10. However, if the temperature of the insulated circuit board 10 is the temperature Ta, pressure applied to the insulated circuit board 10 is low (that is to say, the warp amount W1 is small), and a warp amount of the insulated circuit board 10 which is warped and upward convex is larger than, for example, the warp amount W1a, then the insulated circuit board 10 returns to the state in which the insulated circuit board 10 is warped and upward convex after the pressure is released.

In addition, if the temperature of the insulated circuit board 10 is a temperature Tb still higher than the temperature Ta, then pressure is applied to the insulated circuit board 10 so as to reach the warp amount W1. After the pressure is released, a warp amount W2a (>the warp amount W1a), which is a plastic deformation amount, is relaxed with respect to the insulated circuit board 10 and a state in which the insulated circuit board 10 is warped and downward convex is kept.

By applying pressure to the insulated circuit board having a temperature higher than the yield temperature T1 in this way to make the insulated circuit board 10 warp, a larger warp amount is relaxed. If pressure applied to the insulated circuit board 10 having a temperature higher than the yield temperature T1 is low and the warp amount W1 of the insulated circuit board 10 which is downward convex is small, then a plastic deformation amount is small even at the same temperature and the effect of relaxing warp is small.

On the basis of the above, it is preferable that the temperature of the insulated circuit board 10 at the time of applying pressure to the insulated circuit board 10 be higher than the yield temperature T1 and higher than or equal to 100° C. and lower than or equal to 200° C. and that the warp amount W1 be larger than or equal to 0.05 mm and smaller than or equal to 0.5 mm. It is more preferable that the temperature of the insulated circuit board 10 at the time of applying pressure to the insulated circuit board 10 be higher than or equal to 150° C. and lower than or equal to 200° C. and that the warp amount W1 be larger than or equal to 0.05 mm and smaller than or equal to 0.3 mm. However, the above numerical values apply to a general case where the insulated circuit board 10 includes the wiring boards 12a through 12e made of copper, the insulating plate 11 which is a ceramic plate, and the metal plate 13 made of copper. The above numerical values may change depending on materials for the components of the insulated circuit board 10, the thickness of the components, the shape of the components, or the like.

Next, a takeout subprocess for taking the semiconductor unit 2 out of the cooling apparatus 8 is performed (step S16 of FIG. 6). The semiconductor unit 2 cooled in step S15 is taken out of the cooling apparatus 8. The semiconductor unit 2 taken out of the cooling apparatus 8 keeps a warped and downward convex state. Subsequently to the takeout subprocess, the processes in steps S3 and S4 of the flow chart illustrated in FIG. 5 are performed by the use of the semiconductor unit 2 and the semiconductor device 1 illustrated in FIG. 1 and FIG. 2 is obtained.

Figure 18:
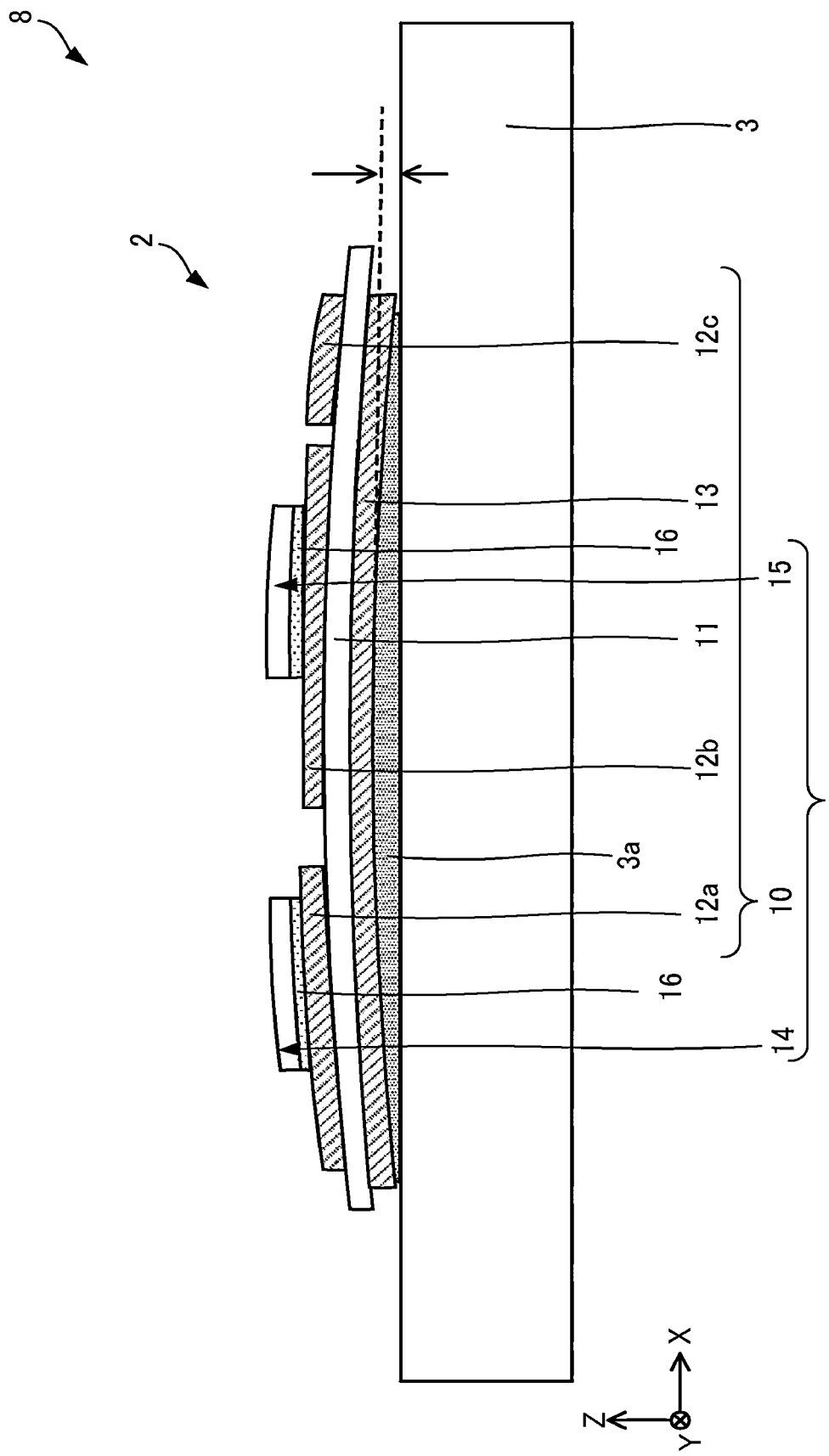
FIG. 18 illustrates a wiring and housing process included in a semiconductor device manufacturing method taken as a reference example.

A case where the semiconductor unit 2 manufactured without applying pressure to the semiconductor unit 2 in the cooling subprocess in step S15 of FIG. 6 is bonded to the metal base plate 3 (step S3 of FIG. 5) will now be described with reference to FIG. 18. FIG. 18 illustrates a wiring and housing process included in a semiconductor device manufacturing method taken as a reference example. FIG. 18 illustrates a case where the semiconductor unit 2 manufactured without applying pressure to the semiconductor unit 2 in the cooling subprocess in step S15 of FIG. 6 is bonded to the metal base plate 3 (step S3 of FIG. 5).

The semiconductor unit 2 of the semiconductor assembly 6 manufactured in step S13 of FIG. 6 is cooled through step S14 of FIG. 6. As a result, as stated above, the metal plate 13 significantly contracts due to difference in linear expansion coefficient among the insulating plate 11, the wiring boards 12a through 12e, and the metal plate 13 of the insulated circuit board 10. Accordingly, the insulated circuit board 10 warps with the side of the wiring boards 12a through 12e up and becomes upward convex.

As illustrated in FIG. 18, this semiconductor unit 2 is bonded to the front surface of the metal base plate 3 with the bonding member 3a therebetween. The semiconductor unit 2 is warped and upward convex. As a result, the thickness of the bonding member 3a between the semiconductor unit 2 and the metal base plate 3 is not uniform as a whole. In particular, the bonding member 3a right under a central portion of the semiconductor unit 2 which is warped and upward convex is thick. The bonding member 3a having different thicknesses in this way may cause deterioration in the cooling property of the semiconductor unit 2.

With the above method for manufacturing the semiconductor device 1, first, the semiconductor chips 14 and 15, the bonding member 16, and the insulated circuit board 10 including the insulating plate 11, the wiring boards 12a through 12e formed over the front surface of the insulating plate 11, and the metal plate 13 formed on the back surface of the insulating plate 11 are prepared. The semiconductor unit 2 is assembled by locating the semiconductor chips 14 and 15 over the wiring boards 12a and 12b, respectively, with the bonding member 16 therebetween. Then, the semiconductor unit 2 is heated, and is cooled.

When the semiconductor unit 2 is heated, heating is performed by the use of the heater 7a having the flat heating surface 7a1 in a state in which the lower surface of the insulated circuit board 10 is placed on the heating surface 7a1. When the semiconductor unit 2 is cooled, cooling is performed by the use of the cooler 8a having the cooling surface 8a1 including the pair of support portions 8a2 in a state in which the lower surface of the pair of outer regions opposite the pair of support portions 8a2 of the insulated circuit board 10 is located on the pair of support portions 8a2 so as to come in contact with the pair of support portions 8a2, in which the upper surface of the central region of the insulated circuit board 10 between the pair of outer regions is pressed downward, and in which the insulated circuit board is downward convex.

With the semiconductor unit 2 obtained in this way, the occurrence of a state in which the semiconductor unit 2 is warped and upward convex is suppressed. That is to say, the semiconductor unit 2 is in a warped and downward convex state. As a result, when the semiconductor unit 2 is bonded to the metal base plate 3, a large gap is not formed between the semiconductor unit 2 and the metal base plate 3. This suppresses deterioration in the heat dissipation property of the semiconductor unit 2. Accordingly, deterioration in the reliability of the semiconductor device 1 including the semiconductor unit 2 is suppressed.

Modification 1-1

Figure 19:
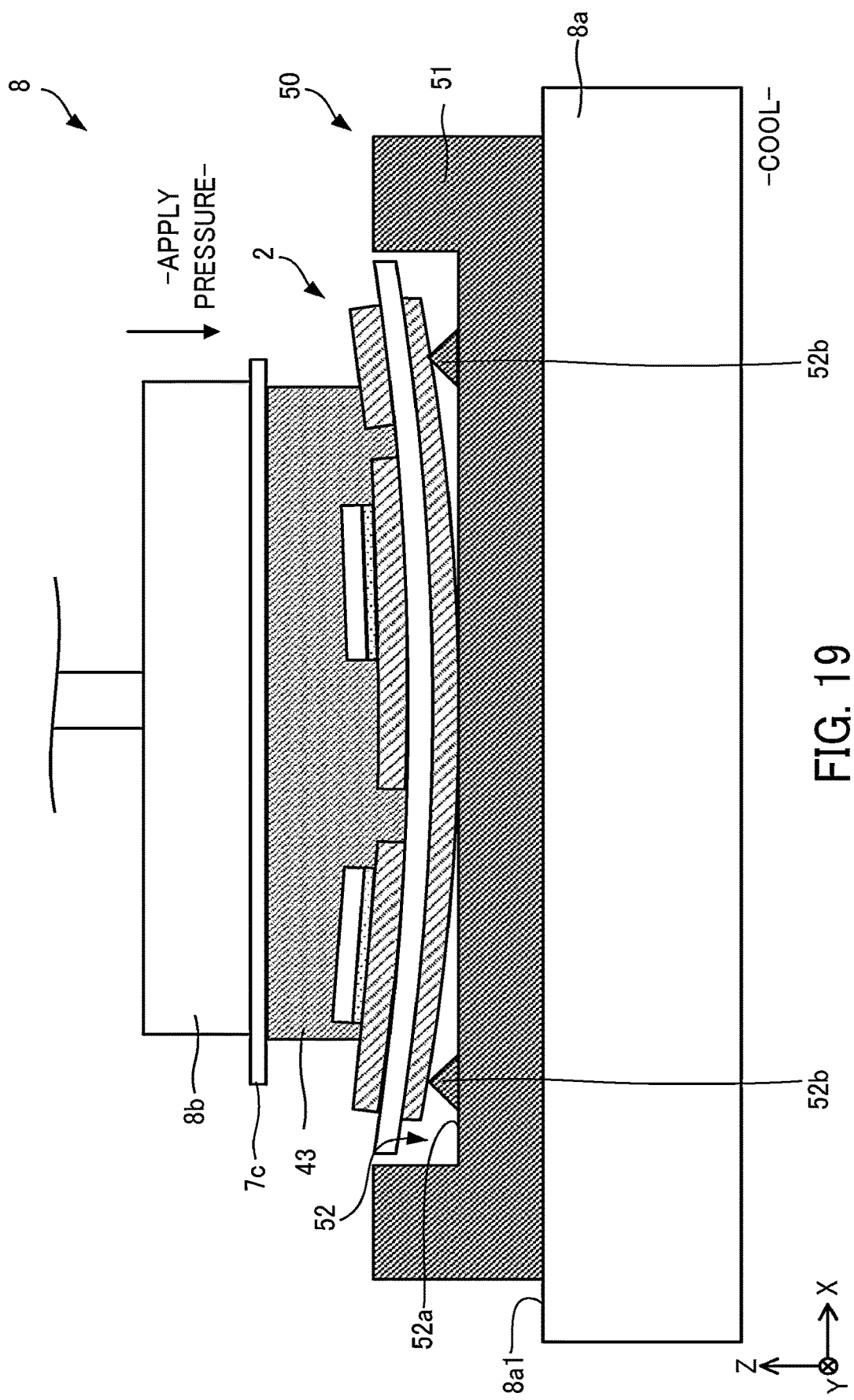
FIG. 19 illustrates a cooling subprocess (applying pressure) included in a chip bonding process according to modification 1-1 of the first embodiment.

In modification 1-1, another form of the cooling apparatus 8 used in the cooling subprocess in step S15 of FIG. 6 will be described with reference to FIG. 19. FIG. 19 illustrates a cooling subprocess (applying pressure) included in a chip bonding process according to modification 1-1 of the first embodiment.

As stated above, there is need to apply pressure to the semiconductor unit 2 at a temperature higher than or equal to the yield temperature T1 in the cooling subprocess in step S15 of FIG. 6. For example, if the temperature of a cooler 8a is low (a cooling speed is high) at the time of applying pressure to the semiconductor unit 2 or if the thermal capacity of the semiconductor unit 2 is small at the time of applying pressure to the semiconductor unit 2, then the temperature of the semiconductor unit 2 suddenly falls and there may be delay in applying the pressure. Accordingly, as illustrated in FIG. 19, a cooling jig 50 preheated for keeping the semiconductor unit 2 at a temperature higher than or equal to the yield temperature T1 may be used. In this case, however, support portions 8a2 are not formed on a cooling surface 8a1 of the cooler 8a of a cooling apparatus 8. The cooling jig 50 in which the semiconductor unit 2 is housed is located on the cooling surface 8a1.

The cooling jig 50 includes a body portion 51 and a cooling area 52 formed in the body portion 51. The body portion 51 contains as a main ingredient a material, such as a ceramic, having a good heat retaining property. The body portion 51 has the shape of a flat plate.

The cooling area 52 is formed in the front surface of the body portion 51, is rectangular in plan view, and is a concave recess. A cooling surface 52a, which is a bottom surface of the cooling area 52, is approximately parallel to the front surface of the body portion 51. The external shape of the cooling area 52 corresponds to the external shape of the insulated circuit board 10 in plan view. The depth of the cooling area 52 is equal to or slightly greater than the thickness of the insulated circuit board 10 including the height of support portions 52b described later. The cooling surface 52a of the cooling area 52 is substantially flat and may include warp or undulation caused by cooling, pressurization, or the like. The flatness of the cooling surface 52a of the cooling area 52 is 0.2 mm or less. The flatness of the cooling surface 52a of the cooling area 52 is preferably 0.1 mm or less. Furthermore, a pair of support portions 52b are formed on the cooling surface 52a of the cooling area 52. The shape of the support portions 52b may be the same as that of the support portions 8a2 illustrated in FIG. 13 and FIG. 14 and the same effect is achieved. The support portions 52b and the cooling area 52 of the body portion 51 may be integrally formed.

A case where the cooling jig 50 is used in the chip bonding process of FIG. 6 will be described. As described in the flow chart of FIG. 6, the semiconductor assembly 6 is heated through steps S11 through S13 (semiconductor chips 14 and 15 are bonded to the insulated circuit board 10).

Next, a transportation subprocess for transporting the semiconductor unit 2 included in the semiconductor assembly 6 from the sintering apparatus 7 to the cooling apparatus 8 is performed (step S14 of FIG. 6). The semiconductor assembly 6 is taken out of the sintering apparatus 7 and is transported to the cooling apparatus 8. The semiconductor unit 2 taken out of the positioning jig 40 is housed in the cooling area 52 of the cooling jig 50. At this time, the semiconductor unit 2 may be housed in the cooling area 52 in a state in which the upper surface of the semiconductor unit 2 is covered with the buffer material 43 and the protection sheet 7c. Furthermore, the semiconductor unit 2 is housed in the cooling area 52 with the semiconductor chips 14 and 15 as a front surface. That is to say, the back surface of the pair of outer regions of the insulated circuit board 10 is supported on the pair of support portions 52b. The cooling jig 50 in which the semiconductor unit 2 is housed in this way is carried in a chamber of the cooling apparatus 8 and is placed on the cooling surface 8a1 of the cooler 8a. The semiconductor unit 2 is housed in the cooling area 52 with the semiconductor chips 14 and 15 as a front surface. A pressurizer 8b is moved over the cooling surface 8a1 and the semiconductor chips 14 and 15 of the semiconductor unit 2 are pressed downward (in the –Z direction) by the pressurizer 8b with the protection sheet 7c and the buffer material 43 therebetween. At this time, the pressurizer 8b applies pressure to the central region (see FIGS. 3A and 3B) of the insulated circuit board 10 including the semiconductor chips 14 and 15. This is the same with FIG. 13 and FIG. 14.

Next, a cooling subprocess for applying pressure to the semiconductor unit 2 under cooling is performed (step S15 of FIG. 6). The cooler 8a begins cooling the cooling surface 8a1 over which the semiconductor unit 2 is located and the semiconductor unit 2 is pressed in the –Z direction under determined pressure by the pressurizer 8b. This is the same with the first embodiment.

At this time, the semiconductor unit 2 is kept by the cooling jig 50 at a temperature higher than or equal to the yield temperature T1 and a cooling speed is reduced. As a result, pressure is applied to the semiconductor unit 2 at a suitable temperature. Because the semiconductor unit 2 is pressurized while holding sufficient heat, plastic deformation occurs. The pressure applied to the semiconductor unit 2 by the pressurizer 8b is released. As illustrated in FIG. 19, the semiconductor unit 2 (insulated circuit board 10) is kept in a warped and downward convex state.

Even in the case of modification 1-1, the semiconductor unit 2 is in a warped and downward convex state when cooling is performed after heating. This is the same with the first embodiment. As a result, when the semiconductor unit 2 is bonded to the metal base plate 3, a large gap is not formed between the semiconductor unit 2 and the metal base plate 3. This suppresses deterioration in the heat dissipation property of the semiconductor unit 2. Accordingly, deterioration in the reliability of the semiconductor device 1 including the semiconductor unit 2 is suppressed.

Modification 1-2

Figure 20A:
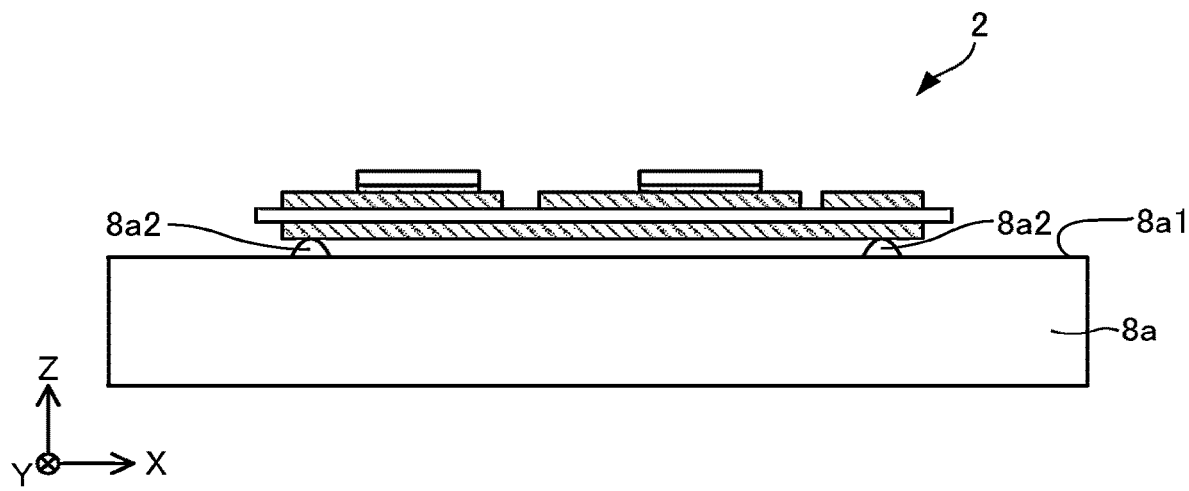
FIGS. 20A and 20B illustrate a cooling apparatus used in a cooling subprocess included in a chip bonding process according to modification 1-2 of the first embodiment.
Figure 20B:
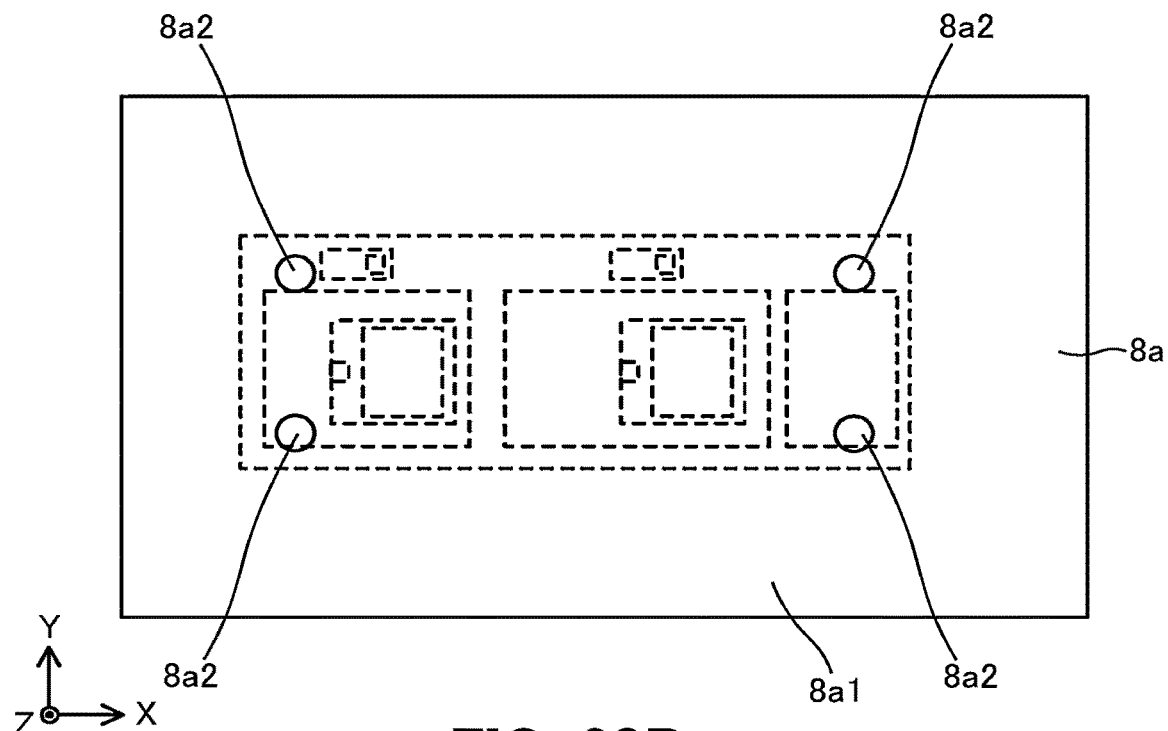

In modification 1-2, another form of the support portions 8a2 included in the cooling apparatus 8 will be described with reference to FIGS. 20A and 20B. FIGS. 20A and 20B illustrate a cooling apparatus used in a cooling subprocess included in a chip bonding process according to modification 1-2 of the first embodiment. FIGS. 20A and 20B do not illustrate a pressurizer 8b included in a cooling apparatus 8. FIG. 20A is a side view of the cooling apparatus 8. FIG. 20B is a plan view of the cooling apparatus 8. In FIG. 20B, the position of the semiconductor unit 2 is indicated by dashed lines.

In modification 1-2, support portions 8a2 are formed on a cooling surface 8a1 of a cooler 8a so that they will be opposed to the four corners of the pair of outer regions of the insulated circuit board 10. Each support portion 8a2 is convex. That is to say, for example, each support portion 8a2 may have the shape of a cube, a cylinder, a hemisphere, a truncated quadrangular pyramid, or a truncated cone. The surfaces of the support portions 8a2 which support the insulated circuit board 10 have area which is such that the insulated circuit board 10 is properly supported.

Even if the cooling apparatus 8 including the above support portions 8a2 is used in step S15 of FIG. 6, the back surface of the insulated circuit board 10 is reliably supported when pressure is applied to the semiconductor unit 2. This contributes to warp of the insulated circuit board 10.

Modification 1-3

Figure 21A:
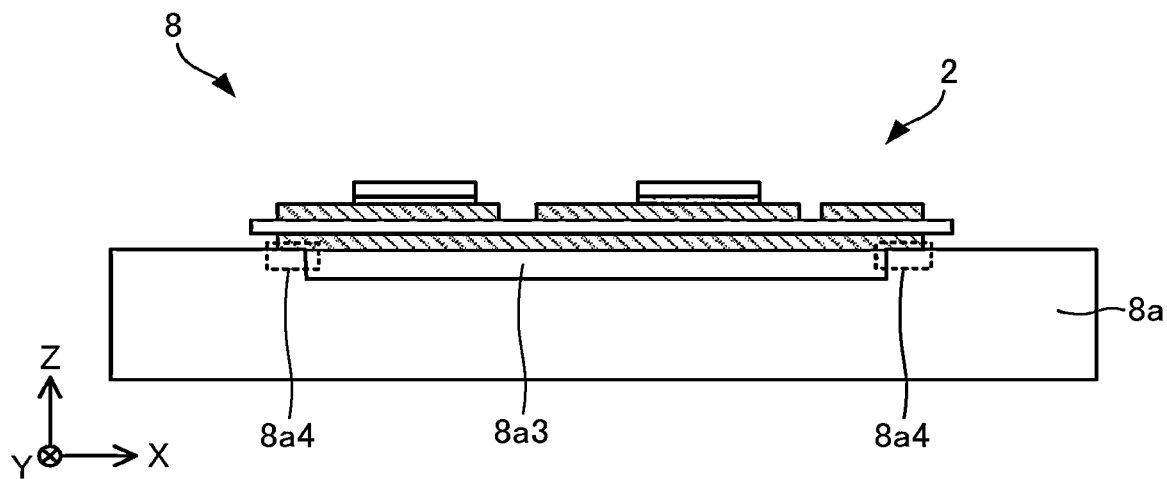
FIGS. 21A and 21B illustrate a cooling apparatus used in a cooling subprocess included in a chip bonding process according to modification 1-3 of the first embodiment.
Figure 21B:
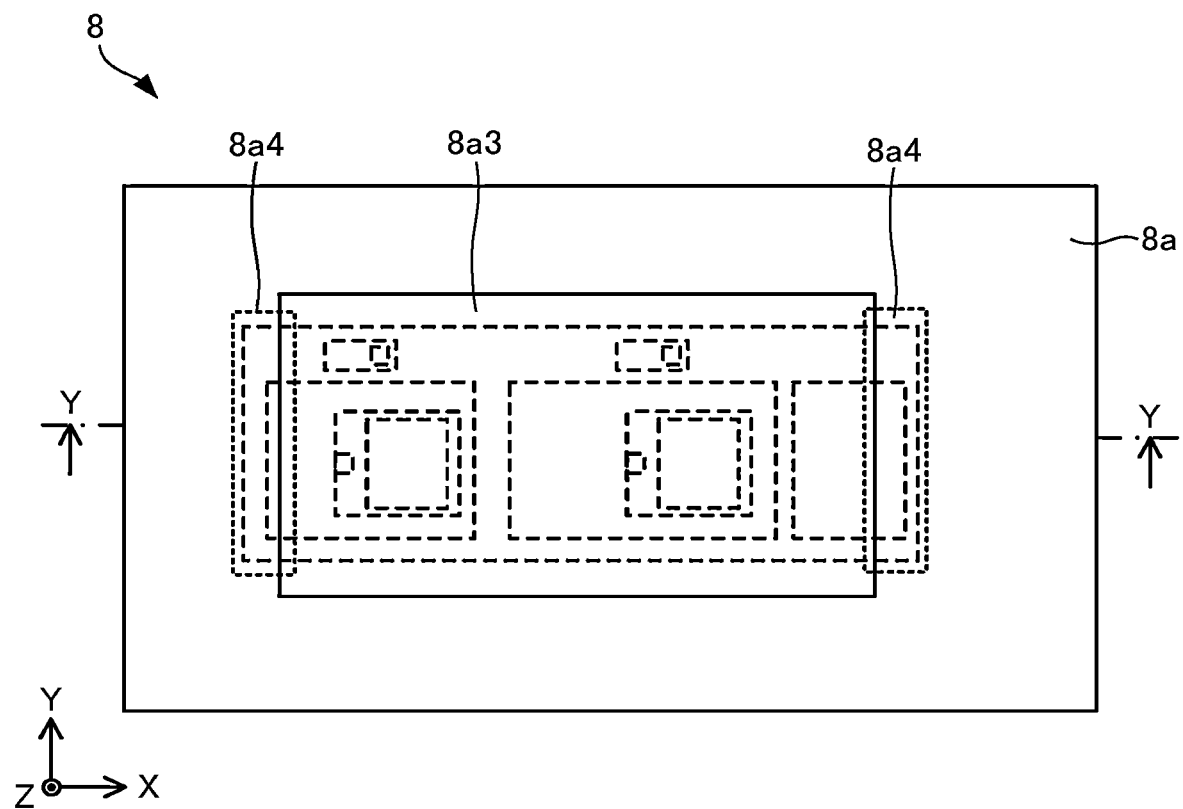

In modification 1-3, another method for supporting the back surface of the insulated circuit board 10 by a cooler 8a of a cooling apparatus 8 will be described with reference to FIGS. 21A and 21B. FIGS. 21A and 21B illustrate a cooling apparatus used in a cooling subprocess included in a chip bonding process according to modification 1-3 of the first embodiment. FIGS. 21A and 21B do not illustrate a pressurizer 8b included in a cooling apparatus 8. FIG. 21A is a sectional view taken along the dot-dash line Y-Y of FIG. 21B. FIG. 21B is a plan view of the cooling apparatus 8. In FIG. 21B, the position of the semiconductor unit 2 is indicated by dashed lines.

In modification 1-3, support portions 8a2 are not formed on a cooling surface 8a1 of a cooler 8a. An opening 8a3 is formed in the cooling surface 8a1 of the cooler 8a. The opening 8a3 is rectangular in plan view. A pair of long sides of the opening 8a3 may be shorter than a pair of long sides of the insulated circuit board 10. A pair of short sides of the opening 8a3 are longer than the pair of short sides of the insulated circuit board 10. Furthermore, a pair of support portions 8a4, which are a pair of opening edge portions, are set on the side of the pair of short sides of the opening 8a3. As described later, when the insulated circuit board 10 is located on the opening 8a3, the pair of support portions 8a4 are situated under the pair of outer regions of the insulated circuit board 10. In addition, the depth of the opening 8a3 corresponds to the height of the support portions 8a2 in the first embodiment described above.

When a transportation subprocess is performed in step S14 of FIG. 6, the semiconductor unit 2 is transported to the cooling apparatus 8 and is located on the cooling surface 8a1 of the cooler 8a in a chamber of the cooling apparatus 8. As illustrated in FIGS. 21A and 21B, at this time, the pair of outer regions of the insulated circuit board 10 of the semiconductor unit 2 is located on the pair of support portions 8a4 on the side of the pair of short sides of the opening 8a3 of the cooling surface 8a1.

Furthermore, when a cooling subprocess is performed in step S15 of FIG. 6, the semiconductor unit 2 on the cooler 8a is pressed in the –Z direction by the pressurizer 8b. This is the same with the first embodiment. The back surface of the pair of outer regions of the insulated circuit board 10 is supported on the pair of support portions 8a4 and the front surface of the central region of the insulated circuit board 10 is pressed in the −Z direction by the pressurizer 8b. As a result, the back surface of the insulated circuit board 10 enters the opening 8a3 and the semiconductor unit 2 (insulated circuit board 10) is kept in a warped and downward convex state.

Even in the case of modification 1-3, the semiconductor unit 2 is kept in a warped and downward convex state. This is the same with the first embodiment. As a result, when the semiconductor unit 2 is bonded to the metal base plate 3, a large gap is not formed between the semiconductor unit 2 and the metal base plate 3. This suppresses deterioration in the heat dissipation property of the semiconductor unit 2. Accordingly, deterioration in the reliability of the semiconductor device 1 including the semiconductor unit 2 is suppressed.

Second Embodiment

In a second embodiment, description will be given with a case where the bonding member 16 in the first embodiment is solder as an example. A semiconductor device 1 according to a second embodiment differs from the semiconductor device 1 according to the first embodiment only in that a bonding member 16 is solder. Parts of the second embodiment which differ from those of the first embodiment will mainly be described.

The semiconductor device 1 according to the second embodiment is manufactured through each process of the flow chart of FIG. 5. Step S1 of FIG. 5 performed in the second embodiment differs from step S1 of FIG. 5 performed in the first embodiment only in that the bonding member 16, which is solder, is prepared. Steps S3 and S4 of FIG. 5 performed in the second embodiment are also the same as steps S3 and S4, respectively, of FIG. 5 performed in the first embodiment. Step S2 of FIG. 5 will be described with reference to FIG. 22 and FIG. 23.

Figure 22:
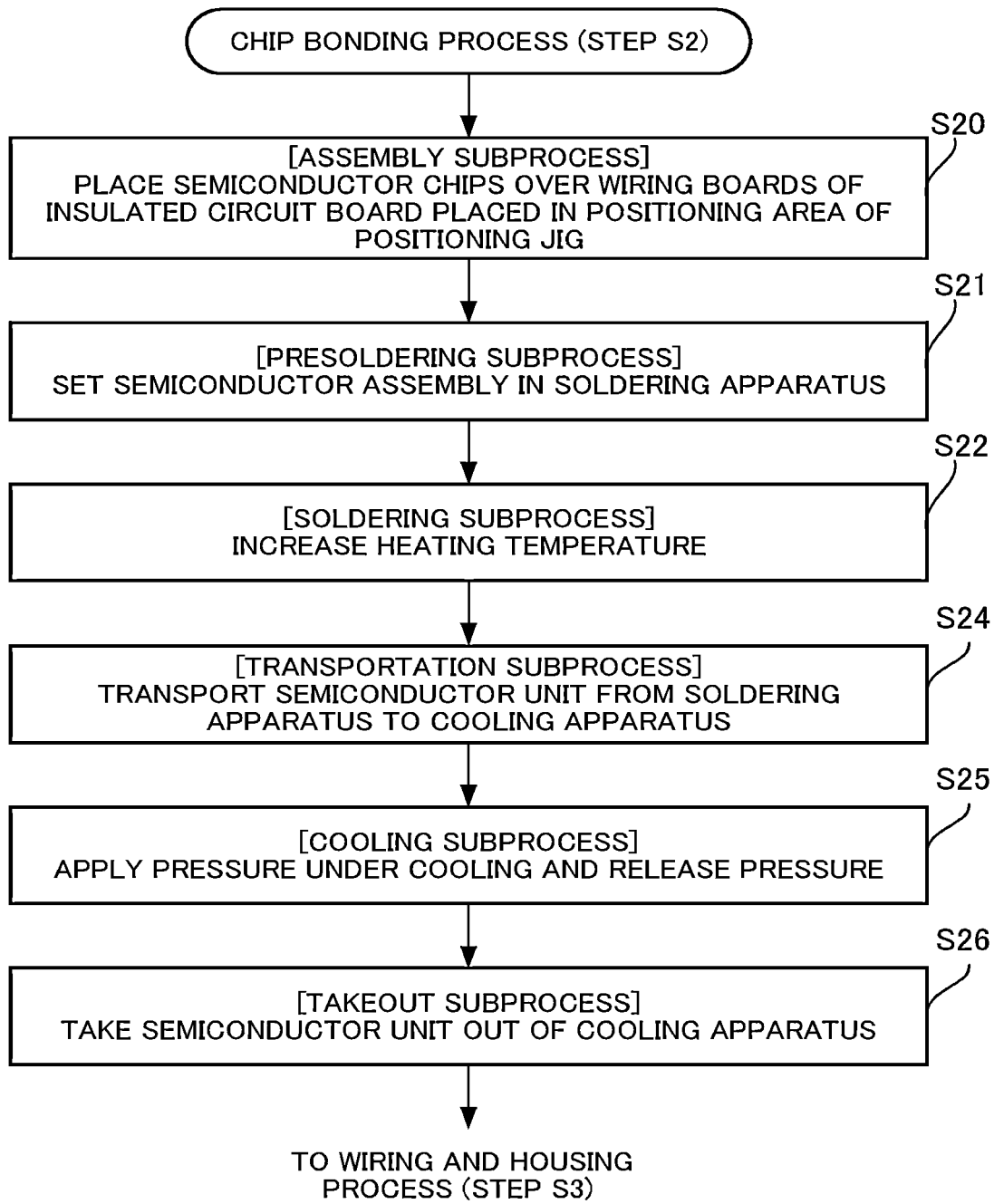
FIG. 22 is a flow chart illustrative of a chip bonding process according to a second embodiment included in a method for manufacturing a semiconductor device.
Figure 23:
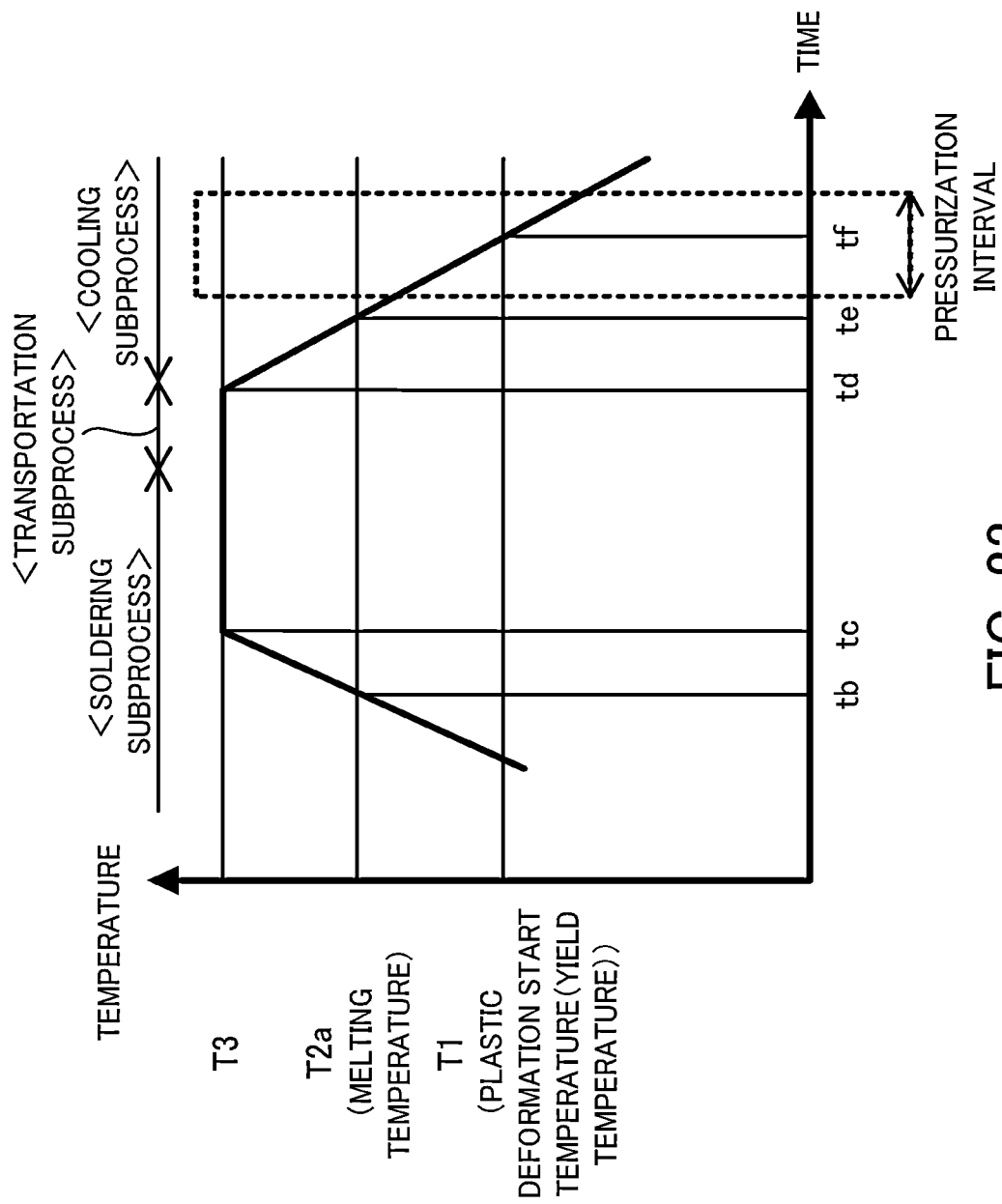
FIG. 23 is a graph indicative of a change in the temperature of a semiconductor unit in the chip bonding process according to the second embodiment.

FIG. 22 is a flow chart illustrative of a chip bonding process according to a second embodiment included in a method for manufacturing a semiconductor device. FIG. 23 is a graph indicative of a change in the temperature of a semiconductor unit in the chip bonding process according to the second embodiment. In FIG. 23, a horizontal axis indicates time and a vertical axis indicates the temperature of a semiconductor unit 2. Furthermore, FIG. 23 indicates a change in the temperature of the semiconductor unit 2 from a soldering subprocess to a cooling subprocess. In FIG. 23, a temperature at which the bonding member 16, which is solder, melts is a melting temperature T2a.

The chip bonding process in step S2 of FIG. 5 is performed in accordance with the flow chart of FIG. 22. First, an assembly subprocess for assembling the semiconductor assembly 6 by arranging the semiconductor chips 14 and 15 over determined areas of the wiring boards 12a and 12b, respectively, of the insulated circuit board 10 is performed (step S20 of FIG. 22). The insulated circuit board 10 is placed on the positioning jig 40. The semiconductor chips 14 and 15 are placed over the wiring boards 12a and 12b, respectively, of the insulated circuit board 10 placed in the positioning area 42 of the positioning jig 40 with the bonding member 16 therebetween. The semiconductor assembly 6 is obtained in this way.

Next, a presoldering subprocess for setting the semiconductor assembly 6 in a soldering apparatus 9 (step S21 of FIG. 22). The soldering apparatus 9 includes in a chamber a heater 9a including a heating surface 9a1. The soldering apparatus 9 illustrated later in FIG. 24 includes the heater 9a in the chamber (not illustrated). The heater 9a includes the heating surface 9a1 on which the semiconductor assembly 6 is placed. The temperature of the heating surface 9a1 is increased and decreased by the heater 9a at a determined heating speed. The heating surface 9a1 is substantially flat and may include warp or undulation caused by heating, pressurization, or impact from the outside. The flatness of the heating surface 9a1 is 0.2 mm or less. The flatness of the heating surface 9a1 is preferably 0.1 mm or less. The heating and filling the chamber with nitrogen and discharging nitrogen from the chamber described later are controlled by a controller (not illustrated) included in the soldering apparatus 9.

Next, a soldering subprocess for increasing the heating temperature of the heater 9a is performed (step S22 of FIG. 22). The soldering subprocess will now be described with reference to FIG. 24. FIG. 24 illustrates the soldering subprocess included in the chip bonding process according to the second embodiment.

As indicated in <soldering subprocess> in FIG. 23, the temperature of the semiconductor assembly 6 (semiconductor unit 2) rises by heating by the heater 9a. When a determined time tb elapses after the beginning of the heating, the temperature of the semiconductor assembly 6 (semiconductor unit 2) reaches the melting temperature T2a of the bonding member 16 and the bonding member 16, which is solder, begins to melt. At this time, for example, the melting temperature T2a is higher than or equal to 180° C. and lower than or equal to 240° C. if the bonding member 16 contains solder as a main ingredient.

Heating by the heater 9a is performed further. When a determined time tc (>tb) elapses after the beginning of the heating, the temperature of the semiconductor assembly 6 reaches a determined temperature T3 (>temperature T2a). The temperature T3 is kept for a determined time. The molten state of the bonding member 16 is kept for this period.

Next, a transportation subprocess for transporting the semiconductor unit 2 included in the semiconductor assembly 6 from the soldering apparatus 9 to the cooling apparatus 8 is performed (step S24 of FIG. 22). The semiconductor assembly 6 is taken out of the soldering apparatus 9 and is transported to the cooling apparatus 8. This is the same with the first embodiment (step S14 of FIG. 6). That is to say, when the semiconductor unit 2 is transported to the cooling apparatus 8, the positioning jig 40 may be used as a tray. By using the positioning jig 40 for transporting the semiconductor unit 2, the temperature T3 of the semiconductor unit 2 is kept until the next cooling subprocess (see <transportation subprocess> in FIG. 23).

The semiconductor unit 2 taken out of the positioning jig 40 is carried in the chamber of the cooling apparatus 8 and is placed over the cooling surface 8a1 of the cooler 8a. In this case, the pair of outer regions (see FIGS. 3A and 3B) of the insulated circuit board 10 placed over the cooling surface 8a1 are supported on the pair of support portions 8a2. This is the same with the first embodiment. The pressurizer 8b is moved over the cooling surface 8a1. The pressurizer 8b presses the semiconductor chips 14 and 15 of the semiconductor unit 2 with the protection sheet 7c and the buffer material 43 therebetween (see FIG. 13 and FIG. 14).

Next, a cooling subprocess for applying pressure to the semiconductor unit 2 under cooling is performed (step S25 of FIG. 22). At the same time that the semiconductor unit 2 transported to the cooling apparatus 8 is cooled by the cooler

8a, pressure is applied to the semiconductor unit 2 by the pressurizer 8b. This is the same with the first embodiment. In the second embodiment, applying pressure to the semiconductor unit 2 by the pressurizer 8b is begun when the temperature of the insulated circuit board 10 (bonding member 16) is in a range (pressurization interval in FIG. 23) lower than the melting temperature T2a and higher than the yield temperature T1.

As stated above, because the temperature of the insulated circuit board 10 is higher than the yield temperature T1, plastic deformation of the insulated circuit board 10 occurs. Furthermore, in the second embodiment, the temperature of the insulated circuit board 10 is lower than the melting temperature T2a. As a result, the bonding member 16, which is solder, solidifies and the semiconductor chips 14 and 15 are bonded to the insulated circuit board 10. This prevents the positional deviation of the semiconductor chips 14 and 15 when pressure is applied to the insulated circuit board 10. After applying pressure to the insulated circuit board 10 by the pressurizer 8b is begun, determined pressure is maintained. Until the temperature of the insulated circuit board 10 falls below the yield temperature T1, pressure is applied to the insulated circuit board 10 by the pressurizer 8b.

When the temperature of the insulated circuit board falls below the yield temperature T1, the pressure applied to the semiconductor unit 2 by the pressurizer 8b is released. As a result, the semiconductor unit 2 (insulated circuit board 10) is kept in a warped and downward convex.

Next, a takeout subprocess for taking the semiconductor unit 2 out of the cooling apparatus 8 is performed (step S26 of FIG. 22). The semiconductor unit 2 cooled in step S25 is taken out of the cooling apparatus 8. The semiconductor unit 2 taken out of the cooling apparatus 8 keeps a warped and downward convex state. Subsequently to the takeout subprocess, the processes in steps S3 and S4 of the flow chart illustrated in FIG. 5 are performed by the use of the semiconductor unit 2 and the semiconductor device 1 illustrated in FIG. 1 and FIG. 2 is obtained.

Even in the case of the second embodiment, the occurrence of a state in which the semiconductor unit 2 is warped and upward convex is suppressed. This is the same with the first embodiment. That is to say, the semiconductor unit 2 is in a warped and downward convex state. As a result, when the semiconductor unit 2 is bonded to the metal base plate 3, a large gap is not formed between the semiconductor unit 2 and the metal base plate 3. This suppresses deterioration in the heat dissipation property of the semiconductor unit 2. Accordingly, deterioration in the reliability of the semiconductor device 1 including the semiconductor unit 2 is suppressed.

In the second embodiment, the cooling jig 50 in modification 1-1 may be used. Furthermore, in the second embodiment, the support portions 8a2 in modification 1-2 or the opening 8a3 in modification 1-3 may be applied to the cooler 8a of the cooling apparatus 8.

According to the disclosed techniques, the occurrence of a state in which an insulated circuit board is warped and upward convex is suppressed and deterioration in the reliability of a semiconductor device is suppressed.

All examples and conditional language provided herein are intended for the pedagogical purposes of aiding the reader in understanding the invention and the concepts contributed by the inventor to further the art, and are not to be construed as limitations to such specifically recited examples and conditions, nor does the organization of such examples in the specification relate to a showing of the superiority and inferiority of the invention. Although one or more embodiments of the present invention have been described in detail, it should be understood that various changes, substitutions, and alterations could be made hereto without departing from the spirit and scope of the invention.

What is claimed is:

1. A semiconductor device manufacturing method, comprising:
   preparing a semiconductor chip, a bonding member, and an insulated circuit board including an insulating plate, a wiring board on a front surface of the insulating plate, and a metal plate on a back surface of the insulating plate;
   assembling a semiconductor unit by arranging the semiconductor chip on the wiring board with the bonding member therebetween;
   heating the semiconductor unit; and
   cooling the semiconductor unit, wherein:
   in the heating the semiconductor unit, a heater having a heating surface including a flat surface is used for performing the heating in a state in which a lower surface of the insulated circuit board is placed on the flat surface; and
   in the cooling the semiconductor unit, a cooler having a cooling surface including a pair of support portions is used for performing the cooling in a state
      in which lower surfaces of a pair of outer regions of the insulated circuit board are respectively placed in contact with the pair of support portions, and
      in which a central region between the pair of outer regions of the insulated circuit board is pressed downward so as to be downwardly convex.

2. The semiconductor device manufacturing method according to claim 1, further comprising transporting the semiconductor unit from the heater to the cooler after the heating the semiconductor unit before the cooling the semiconductor unit.

3. The semiconductor device manufacturing method according to claim 2, wherein in the transporting the semiconductor unit, the semiconductor unit is placed in a cooling jig an interior of which is maintained at a temperature higher than or equal to a determined temperature and is transported to the cooler.

4. The semiconductor device manufacturing method according to claim 1, wherein:
   the semiconductor chip is provided in plurality; and
   all of the plurality of semiconductor chips are placed within the central region of the insulated circuit board.

5. The semiconductor device manufacturing method according to claim 4, wherein the pair of outer regions of the insulated circuit board each extend in a first direction in a plan view of the semiconductor device at least from edges of sides of the insulating plate that are opposite to each other and extend in a second direction orthogonal to the first direction to edges of sides of the metal plate that are opposite to each other and extend in the second direction.

6. The semiconductor device manufacturing method according to claim 5, wherein:
   the wiring board is provided in plurality including a first wiring board and a second wiring board;
   the insulated circuit board is rectangular in a plan view of the semiconductor device with opposite long sides parallel to the first direction and opposite short sides parallel to the second direction; and
   the pair of outer regions of the insulated circuit board each extend in the plan view from respective ones of the opposite short sides to respective sides of the first and second wiring boards that are parallel to the opposite short sides and are closest to the respective opposite short sides.

7. The semiconductor device manufacturing method according to claim 1, wherein in the cooling the semiconductor unit, pressure is applied to the insulated circuit board to be downwardly convex at a temperature higher than a plastic deformation start temperature at which a plastic deformation of the insulated circuit board occurs.

8. The semiconductor device manufacturing method according to claim 1, wherein in the cooling the semiconductor unit, pressure is applied by a pressure device to the insulated circuit board to be downwardly convex with a buffer member placed on an upper surface at the central region of the insulated circuit board.

9. The semiconductor device manufacturing method according to claim 1, wherein:
the insulated circuit board is rectangular in a plan view of the semiconductor device with opposite short sides and opposite long sides; and
the pair of support portions are straight and parallel to the opposite short sides, are convex in a cross-sectional view of the semiconductor device, and are disposed on the cooling surface to face respective ones of the pair of outer regions of the insulated circuit board when the cooler performs the cooling the semiconductor unit.

10. The semiconductor device manufacturing method according to claim 9, wherein the pair of support portions are triangular, square, or semicircular in the cross-sectional view.

11. The semiconductor device manufacturing method according to claim 1, wherein:
the insulated circuit board is rectangular in a plan view of the semiconductor device; and
the pair of support portions are disposed on the cooling surface to face four corners of the insulated circuit board when the cooler performs the cooling the semiconductor unit.

12. The semiconductor device manufacturing method according to claim 11, wherein the pair of support portions have a shape of a cube, a cylinder, a hemisphere, a truncated quadrangular pyramid, or a truncated cone.

13. The semiconductor device manufacturing method according to claim 1, wherein:
the insulated circuit board is rectangular in a plan view of the semiconductor device with opposite long sides and opposite short sides;
the cooling surface of the cooler has an opening with opposite opening long sides that are shorter than the long sides of the insulated circuit board and opposite opening short sides that are longer than the short sides of the insulated circuit board;
the pair of support portions each extend along respective ones of the pair of opening short sides of the opening; and
the insulated circuit board is supported by the pair of support portions so as to cover the opening of the cooling surface.

14. The semiconductor device manufacturing method according to claim 1, wherein the bonding member is a sintered material containing a porous metal.

15. The semiconductor device manufacturing method according to claim 14, wherein in the heating the semiconductor unit, the semiconductor chip is pressed in a direction from an upper surface toward the lower surface of the insulated circuit board.

16. The semiconductor device manufacturing method according to claim 15, wherein pressure applied in the heating the semiconductor unit is higher than pressure applied in the cooling the semiconductor unit, to press the insulated circuit board.

17. The semiconductor device manufacturing method according to claim 1, wherein the bonding member is a solder.

18. The semiconductor device manufacturing method according to claim 17, wherein in the cooling the semiconductor unit, pressure is applied to the insulated circuit board to correct a warp when a temperature of the semiconductor unit falls between a melting point of the bonding member and a yield temperature at which a plastic deformation of the insulated circuit board begins.

19. The semiconductor device manufacturing method according to claim 1, wherein processes from the heating the semiconductor unit to the cooling the semiconductor unit are performed under an atmosphere of a nitrogen.

20. The semiconductor device manufacturing method according to claim 1, wherein
the metal plate covers all over the back surface of the insulating plate except for an area defined by a gap between an outer edge of the insulating plate and an outer edge of the metal plate;
the wiring board is provided in plurality; and
the plurality of wiring boards, which are spaced apart from one another, are disposed all over the front surface of the insulating plate except for areas defined by gaps between the outer edge of the insulating plate and outer edges of outermost wiring boards, the outermost wiring boards among the plurality of the wiring boards being closest to the outer edge of the insulating plate.

* * * * *